United States Patent
Kawaguchi et al.

(10) Patent No.: US 8,310,307 B2
(45) Date of Patent: Nov. 13, 2012

(54) AMPLIFYING CIRCUIT

(75) Inventors: Tsuyoshi Kawaguchi, Osaka (JP);
Mamoru Sekiya, Osaka (JP); Yu Takehara, Osaka (JP); Norimasa Kitagawa, Osaka (JP)

(73) Assignee: Onkyo Corporation, Neyagawa-shi (JP)

( * ) Notice: Subject to any disclaimer, the term of this patent is extended or adjusted under 35 U.S.C. 154(b) by 0 days.

(21) Appl. No.: 13/190,656

(22) Filed: Jul. 26, 2011

(65) Prior Publication Data
US 2012/0049963 A1    Mar. 1, 2012

(30) Foreign Application Priority Data

| Aug. 30, 2010 | (JP) | 2010-191876 |
| Oct. 22, 2010 | (JP) | 2010-237559 |
| May 31, 2011 | (JP) | 2011-121133 |
| May 31, 2011 | (JP) | 2011-121156 |

(51) Int. Cl.
*H03F 3/45* (2006.01)

(52) U.S. Cl. ............... 330/255; 330/265; 330/267

(58) Field of Classification Search ......... 330/252, 330/255, 257, 261, 263, 265, 267
See application file for complete search history.

(56) References Cited

U.S. PATENT DOCUMENTS

| 5,374,897 | A | 12/1994 | Moraveji |
| 5,399,991 | A | 3/1995 | Moraveji |
| 5,510,754 | A | 4/1996 | Moraveji et al. |
| 5,512,859 | A | 4/1996 | Moraveji |
| 5,614,852 | A | 3/1997 | Giordano et al. |
| 5,789,949 | A | 8/1998 | Giordano et al. |
| 5,907,262 | A * | 5/1999 | Graeme et al. ............ 330/255 |
| 6,262,633 | B1 | 7/2001 | Close |
| 6,294,958 | B1 | 9/2001 | Eschauzier |
| 6,437,645 | B1 | 8/2002 | Ivanov et al. |
| 6,724,260 | B2 * | 4/2004 | Varner et al. ............ 330/257 |
| 7,009,450 | B2 * | 3/2006 | Parkhurst et al. ......... 330/255 |
| 7,135,927 | B2 * | 11/2006 | Parkhurst ................. 330/255 |
| 2002/0101286 | A1 | 8/2002 | Escobar-Bowser et al. |
| 2002/0190794 | A1 | 12/2002 | Murray et al. |
| 2006/0186958 | A1 | 8/2006 | Carreto et al. |

FOREIGN PATENT DOCUMENTS

JP    2010-035117    2/2010

OTHER PUBLICATIONS

"Precision Rail-to-Rail Input and Output Operational Amplifiers OP184/OP284/OP484", [online], Analog Devices, Inc, [searched on Sep. 10, 2010], Figure 44, <URL: http://www.analog.com/static/imported-files/data_sheets/OP184_284_484.pdf>.
High Speed, Current-Feedback Operational Amplifier OPA603 URL:http://www.classiccmp.org/rtellason/chipdata/opa603.pdf; 1989.
National Semiconductor Corporation; LM6181 100 mA, 100 MHz Current Feedback Amplifier; 2004.

* cited by examiner

*Primary Examiner* — Khanh V Nguyen
(74) *Attorney, Agent, or Firm* — Renner, Otto, Boisselle & Sklar, LLP

(57) ABSTRACT

The first emitter follower circuit and the second emitter follower circuit can increase an input impedance on the side of the inverting input terminal in the amplifying circuit. As a result, when a feedback circuit is connected between the inverting input terminal and the output terminal of the amplifying circuit, a fluctuation in a gain of the amplifying circuit according to a configuration of the feedback circuit can be suppressed.

10 Claims, 13 Drawing Sheets

AMPLIFYING CIRCUIT

BACKGROUND OF THE INVENTION

1. Field of the Invention

The present invention relates to an amplifying circuit.

2. Description of the Related Art

When operational amplifiers are used, normally a negative feedback circuit for negatively feeding back a part of an output signal is connected between an inverting input terminal and an output terminal. As a result, the operational amplifiers can be used as inverting amplifier circuits or non-inverting amplifier circuits.

Japanese Patent Application Laid-Open No. 2010-35117 discloses a current feedback amplifier that amplifies an audio signal. The current feedback amplifier in Patent Document 1 has an AC feedback loop and a DC feedback loop independently as feedback circuits. The AC feedback loop negatively feeds back a part of an amplified audio signal.

As a characteristic of this current feedback amplifier, an input impedance of the current feedback amplifier is low in view of the AC feedback loop. For this reason, an operation of the current feedback amplifier is changed according to a configuration of the AC feedback loop. That is, a gain of the current feedback amplifier disadvantageously fluctuates due to an impedance of a negative feedback circuit (AC feedback loop).

Non-Patent Document ("Precision Rail-to-Rail Input and Output Operational Amplifiers OP184/OP284/OP484", [online], Analog Devices, Inc, [searched on Sep. 10, 2010], FIG. 44, <URL: http://www.analog.com/static/imported-files/data_sheets/OP18 4_284_484.pdf>) discloses an operational amplifier using a differential amplifier circuit at an input stage. The differential amplifier circuit disclosed in Non-Patent Document has two NPN transistors and a constant current source. A non-inverting input terminal is connected to a base of one NPN transistor. An inverting input terminal is connected to a base of the other NPN transistor. Emitters of the two NPN transistors are each connected to the constant current source.

Since the emitters of the two NPN transistors are connected to the constant current source, a collector current of each of the two NPN transistors is limited to a lower current than a constant current supplied from the constant current source. As a result, the collector currents of the transistors cannot be fluctuated more greatly than the constant current according to a change in an input signal. The operation of conventional differential amplifier circuits is disadvantageously limited by a value of the constant current supplied from the constant current source.

SUMMARY OF THE INVENTION

It is an object of the present invention to provide an amplifying circuit in which a gain does not fluctuate according to a configuration of a negative feedback circuit and its operation is not limited.

It is another object of the present invention to provide an amplifying circuit whose operation is not limited.

An amplifying circuit according to the present invention comprises: a first stage amplifying circuit for amplifying a first input signal to be input into an inverting input terminal and a second input signal to be input into a non-inverting input terminal, and for outputting a first stage amplification signal. The first stage amplifying circuit includes a first transistor forming a first emitter follower circuit whose input is a positive component of the first input signal, a predetermined first potential being applied to a collector of the first transistor, a second transistor forming a second emitter follower circuit whose input is a negative component of the first input signal, a predetermined second potential being applied to a collector of the second transistor, a third transistor forming a third emitter follower circuit whose input is a positive component of the second input signal, a predetermined third potential being applied to a collector of the third transistor, a fourth transistor forming a fourth emitter follower circuit whose input is a negative component of the second input signal, a predetermined fourth potential being applied to a collector of the fourth transistor, a fifth transistor having an emitter to be connected to an output of the first emitter follower circuit, a base to be connected to an output of the third emitter follower circuit, and a collector to which an electric potential of a positive power source is applied via a first collector resistor and from which a positive component of the first stage amplification signal is output, and a sixth transistor having an emitter to be connected to an output of the second emitter follower circuit, a base to be connected to an output of the fourth emitter follower circuit, and a collector to which an electric potential of a negative power source is applied via a second collector resistor and from which a negative component of the first stage amplification signal is output.

The first emitter follower circuit and the second emitter follower circuit can increase an input impedance on the side of the inverting input terminal in the amplifying circuit. As a result, when a feedback circuit is connected between the inverting input terminal and the output terminal of the amplifying circuit, a fluctuation in a gain of the amplifying circuit according to a configuration of the feedback circuit can be suppressed.

When the fifth transistor and the sixth transistor are viewed from the non-inverting input terminal, an emitter grounding amplifier circuit is formed. When the fifth transistor and the sixth transistor are viewed from the inverting input terminal, the base grounding amplifier circuit is formed. The base grounding amplifier circuit outputs a signal whose phase is the same as the input signal and the emitter grounding amplifier circuit outputs a signal whose phase is opposite to the input signal. For this reason, a first stage amplifying circuit can be operated as a differential amplifier circuit for amplifying a difference between a first input signal and a second input signal.

A collector current of the fifth transistor is determined based on an electric potential of a positive power source and a resistance value of a first collector resistor. A collector current of the sixth transistor is determined based on an electric potential of the negative power source and a resistance value of a second collector resistor. For this reason, in comparison with a conventional differential amplifier circuit, upper limit values of the collector currents of the fifth transistor and the sixth transistor are greatly mitigated. When collector currents of the fifth transistor and the sixth transistor are changed according to the first input signal and the second input signal, distortions of waveforms of respective collector currents can be prevented.

Preferably, the first stage amplifying circuit further includes a first resistor to be connected between an emitter of the first transistor and the emitter of the fifth transistor, and a second resistor to be connected between an emitter of the second transistor and the emitter of the sixth transistor.

In the respective emitter resistors of the fifth transistor and the sixth transistor, contribution of the impedances of the emitter internal resistor and the feedback circuit can be reduced. Therefore, a fluctuation in the gain of the amplifying circuit according to the configuration of the feedback circuit can be further suppressed.

Preferably, the first stage amplifying circuit further includes a suppression circuit for suppressing a fluctuation in a potential difference between the base of the fifth transistor and the base of the sixth transistor.

A fluctuation in operating points of the fifth transistor and the sixth transistor for amplifying the first input signal and the second input signal can be suppressed. For this reason, the amplifying circuit can be operated stably.

Preferably, the suppression circuit includes a seventh transistor having a base and a collector to be connected to the base of the fifth transistor, and an emitter to be connected to the emitter of the third transistor, an eighth transistor having a base and a collector to be connected to the base of the sixth transistor, and an emitter to be connected to an emitter of the fourth transistor, a third resistor to be connected between an emitter of the third transistor and the emitter of the seventh transistor, and a fourth resistor to be connected between the emitter of the fourth transistor and the emitter of the eighth transistor.

Preferably, the suppression circuit further includes a first capacitor to be connected between the emitter of the third transistor and the seventh transistor in parallel with the third resistor, and a second capacitor to be connected between the emitter of the fourth transistor and the eighth transistor in parallel with the fourth resistor.

A positive component of the first input signal is input into the base of the fifth transistor without via the third resistor. A negative component of the first input signal is input into the base of the sixth transistor without via the fourth resistor. Since a high-frequency component of the first input signal is amplified without being attenuated, a high-frequency property of the amplifying circuit can be improved.

Preferably, the amplifying circuit further comprises: a subsequent stage amplifying circuit for amplifying the first stage amplification signal; and a buffer circuit for converting an output impedance of the subsequent stage amplifying circuit. The subsequent stage amplifying circuit includes a ninth transistor having a collector to be connected to the buffer circuit and forming an emitter grounding amplifier circuit whose input is the positive component of the first stage amplification signal, a fifth resistor having one end to be connected to the collector of the ninth transistor and the other end to be grounded, a tenth transistor having a collector to be connected to the buffer circuit and forming an emitter grounding amplifier circuit whose input is a negative component of the first stage amplification signal, a sixth resistor having one end to be connected to the collector of the tenth transistor and the other end to be grounded.

In respective collector resistors of the ninth transistor and the tenth transistor, the contribution of impedances of the collector internal resistor and the feedback circuit can be reduced. Therefore, the fluctuation in the gain of the amplifying circuit according to the configuration of the feedback circuit can be further suppressed.

An amplifying circuit according to the present invention comprises: a first stage amplifying circuit for amplifying a first input signal to be input into an inverting input terminal and a second input signal to be input into a non-inverting input terminal and outputting a first stage amplification signal. The first stage amplifying circuit includes a first transistor forming a first emitter follower circuit whose input is a positive component of the second input signal, a predetermined first potential being applied to a collector of the first transistor, a second transistor forming a second emitter follower circuit whose input is a negative component of the second input signal, a predetermined second potential being applied to a collector of the second transistor, a third transistor having an emitter to be connected to the emitter of the first transistor, a fourth transistor having an emitter to be connected to the emitter of the second transistor, a first resistor connected between a collector of the third transistor and a base of the third transistor, a second resistor connected between the base of the third transistor and a base of the fourth transistor, a third resistor connected between a collector of the fourth transistor and the base of the fourth transistor, a fifth transistor having an emitter to which a positive component of the first input signal is input, a base to be connected to the collector of the third transistor, and a collector to which an electric potential of a positive power source is applied via a first collector resistor and from which a positive component of the first stage amplification signal is output, and a sixth transistor having an emitter into which a negative component of the first input signal is input, a base to be connected to a collector of the fourth transistor and a collector to which an electric potential of a negative power source is applied via a second collector resistor and from which a negative component of the first stage amplification signal is output.

When the fifth transistor and the sixth transistor are viewed from the non-inverting input terminal, the emitter grounding amplifier circuit is formed. When the fifth transistor and the sixth transistor are viewed from the inverting input terminal, the base grounding amplifier circuit is formed. The base grounding amplifier circuit outputs a signal whose phase is the same as the input signal, and the emitter grounding amplifier circuit outputs a signal whose phase is opposite to the input signal. For this reason, the first stage amplifying circuit can be operated as a differential amplifier circuit for amplifying a difference between the first input signal and the second input signal.

The collector current of the fifth transistor is determined based on the electric potential of the positive power source and the resistance value of the first collector resistor. The collector current of the sixth transistor is determined based on the electric potential of the negative power source and a resistance value of the second collector resistor. For this reason, in comparison with a conventional differential amplifier circuit, the upper limit values of the collector currents of the fifth transistor and the sixth transistor are greatly mitigated. When the collector currents of the fifth transistor and the sixth transistor change according to the first input signal and the second input signal, the distortion of the waveforms of the respective collector currents can be prevented.

The first emitter follower circuit and the second emitter follower circuit can set a base-to-collector capacitance of the transistor viewed from the non-inverting input terminal to a small value. Therefore, a problem such that the high-frequency components of the signals are attenuated by the base-to-collector capacitance of the transistors and a resistor component of the non-inverting input terminal can be solved.

Preferably, the first stage amplifying circuit further includes a seventh transistor forming a third emitter follower circuit whose input is the positive component of the first input signal, an emitter of the seventh transistor being connected to the emitter of the fifth transistor, a predetermined third potential being applied to a collector of the seventh transistor, and an eighth transistor forming a fourth emitter follower circuit whose input is the negative component of the first input signal, an emitter of the eighth transistor being connected to the emitter of the sixth transistor, a predetermined fourth potential being applied to a collector of the eighth transistor.

The third emitter follower circuit and a fourth emitter follower circuit can increase the input impedance on a side of the inverting input terminal in the amplifying circuit. As a result, when the feedback circuit is connected between the inverting input terminal and the output terminal of the amplifying circuit, the fluctuation in the gain of the amplifying circuit according to the configuration of the feedback circuit can be suppressed.

Preferably, the first stage amplifying circuit further includes a fourth resistor to be connected between the emitter of the seventh transistor and the emitter of the fifth transistor, and a fifth resistor to be connected between the emitter of the eighth transistor and the emitter of the sixth transistor.

In the respective emitter resistors of the seventh transistor and the eighth transistor, contribution of the impedances of the emitter internal resistor and the feedback circuit can be reduced. Therefore, the fluctuation in the gain of the amplifying circuit according to the configuration of the feedback circuit can be further suppressed. Preferably, the amplifying circuit further comprises: a subsequent stage amplifying circuit for amplifying the first stage amplification signal; and a buffer circuit for converting an output impedance of the subsequent stage amplifying circuit. The subsequent stage amplifying circuit includes a ninth transistor having a collector to be connected to the buffer circuit and forming an emitter grounding amplifier circuit whose input is the positive component of the first stage amplification signal, a sixth resistor having one end to be connected to a collector of the ninth transistor and the other end to be grounded, a tenth transistor having a collector to be connected to the buffer circuit and forming an emitter grounding amplifier circuit whose input is the negative component of the first stage amplification signal, a seventh resistor having one end to be connected to a collector of the tenth transistor and the other end to be grounded.

In the collector resistors of the ninth transistor and the tenth transistor, contribution of the impedances of the collector internal resistor and the feedback circuit can be reduced. Therefore, the fluctuation in the gain of the amplifying circuit according to the configuration of the feedback circuit can be further suppressed.

DETAILED DESCRIPTION OF THE PREFERRED EMBODIMENTS

Figure 1:
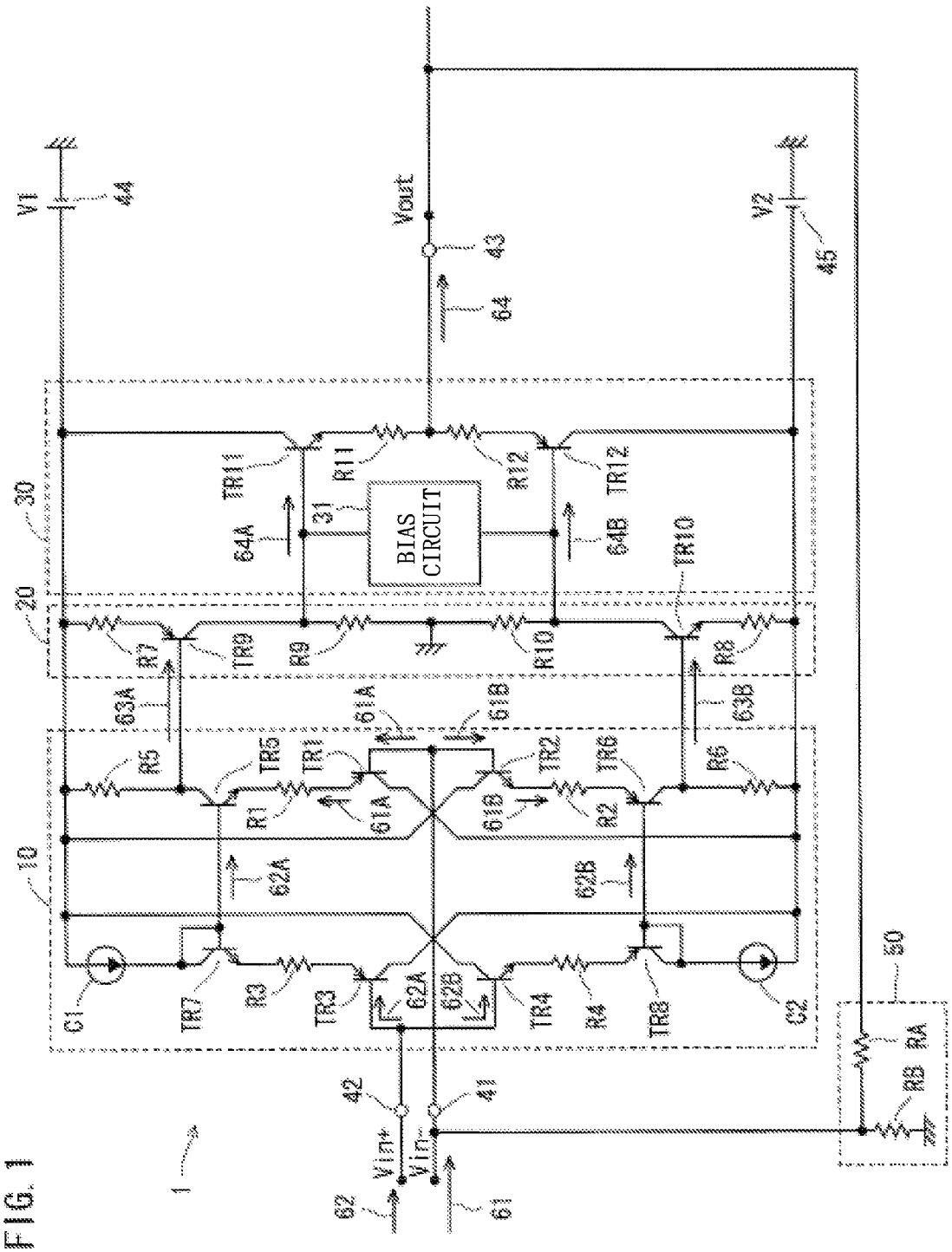
FIG. 1 is a circuit diagram illustrating an amplifying circuit according to an embodiment of the present invention.

Embodiments of the present invention will be described in detail below with reference to the drawings. Like parts or corresponding parts in the drawings are denoted by the like symbols, and the description thereof is not repeated.

{Configuration of Amplifying Circuit 1}

FIG. 1 is a circuit diagram illustrating a configuration of an amplifying circuit 1 according to the embodiment. With reference to FIG. 1, the amplifying circuit 1 includes a first stage amplifying circuit 10, a subsequent stage amplifying circuit 20, a buffer circuit 30, an inverting input terminal 41, a non-inverting input terminal 42, and an output terminal 43. A feedback circuit 50 is separated from the amplifying circuit 1 and connected to an outside of the amplifying circuit 1.

The first stage amplifying circuit 10 amplifies an input signal 61 to be input into the inverting input terminal 41 and an input signal 62 to be input into the non-inverting input terminal 42 and outputs a first stage amplification signal. The first stage amplifying circuit 10 amplifies positive components of the input signals 61 and 62 and negative components of the input signals 61 and 62 individually. A positive component of the first stage amplification signal is a first stage amplification positive component 63A. A negative component of the first stage amplification signal is a first stage amplification negative component 63B.

The subsequent stage amplifying circuit 20 amplifies the first stage amplification signal (the first stage amplification positive component 63A and the first stage amplification negative component 63B) so as to output a subsequent stage amplification signal. A positive component of the subsequent stage amplification signal is a subsequent stage amplification positive component 64A. A negative component of the subsequent stage amplification signal is a subsequent stage amplification negative component 64B.

The buffer circuit 30 converts an output impedance of the subsequent stage amplifying circuit 20. The subsequent stage amplification signal is output as an output signal 64 from the output terminal 43.

{Configuration of the First Stage Amplifying Circuit 10}

A configuration of the first stage amplifying circuit 10 will be described. The first stage amplifying circuit 10 includes transistors TR1 to TR8, resistors R1 to R6 and constant current sources C1 and C2.

The transistor TR1 is a PNP transistor. The transistor TR1 forms an emitter follower circuit whose input is a positive component 61A of the input signal 61. An electric potential V2 of a negative power source 45 is applied to a collector of the transistor TR1.

The transistor TR2 is an NPN transistor that is paired with the transistor TR1. The transistor TR2 forms an emitter follower circuit whose input is a negative component 61B of the input signal 61. An electric potential V1 of a positive power source 44 is applied to a collector of the transistor TR2.

The transistor TR3 is a PNP transistor. The transistor TR3 forms an emitter follower circuit whose input is a positive component 62A of the input signal 62. The electric potential V2 of the negative power source 45 is applied to a collector of the transistor TR3.

The transistor TR4 is an NPN transistor that is paired with the transistor TR3. The transistor TR4 forms an emitter follower circuit whose input is a negative component 62B of the input signal 62. The electric potential V1 of the positive power source 44 is applied to a collector of the transistor TR4.

The transistor TR5 is an NPN transistor. An emitter of the transistor TR5 is connected to an output of an emitter follower circuit of the transistor TR1. A base of the transistor TR5 is connected to an output of an emitter follower circuit of the transistor TR3. The transistor TR5 amplifies the positive component 61A output from the emitter follower circuit of the transistor TR1 and the positive component 62A output from the emitter follower circuit of the transistor TR3, and outputs the first stage amplification positive component 63A.

The transistor TR6 is a PNP transistor that is paired with the transistor TR5. An emitter of the transistor TR6 is connected to an output of an emitter follower circuit of the transistor TR2. A base of the transistor TR6 is connected to an output of an emitter follower circuit of the transistor TR4. The transistor TR6 amplifies the negative component 61B output from the emitter follower circuit of the transistor TR2 and the negative component 62B output from the emitter follower circuit of the transistor TR4, and outputs the first stage amplification negative component 63B.

The resistor R1 is an emitter resistor of the transistor TR5. The resistor R5 is a collector resistor of the transistor TR5. The resistor R2 is an emitter resistor of the transistor TR6. The resistor R6 is a collector resistor of the transistor TR6.

The transistors TR7 and TR8 and the resistors R3 and R4 form a suppression circuit for suppressing a fluctuation in a potential difference between the base of the transistor TR5 and the base of the transistor TR6 (hereinafter, "differential potential"). The transistor TR7 is an NPN transistor. The transistor TR8 is a PNP transistor that is paired with the transistor TR7.

Connection of respective elements forming the first stage amplifying circuit 10 will be described below. The inverting input terminal 41 is connected to bases of the transistors TR1 and TR2. The non-inverting input terminal 42 are connected to bases of the transistors TR3 and TR4.

One end of the resistor R1 is connected to the emitter of the transistor TR5. The other end of the resistor R1 is connected to the emitter of the transistor TR1. The collector of the transistor TR1 is connected to the negative power source 45.

One end of the resistor R2 is connected to the emitter of the transistor TR6. The other end of the resistor R2 is connected to the emitter of the transistor TR2. The collector of the transistor TR2 is connected to the positive power source 44.

One end of the resistor R3 is connected to the emitter of the transistor TR7. The other end of the resistor R3 is connected to the emitter of the transistor TR3. The collector of the transistor TR3 is connected to the negative power source 45.

One end of the resistor R4 is connected to the emitter of the transistor TR8. The other end of the resistor R4 is connected to the emitter of the transistor TR4. The collector of the transistor TR4 is connected to the positive power source 44.

The collector of the transistor TR7 is connected to the positive power source 44 via the constant current source C1. A base of the transistor TR7 is connected to the base of the transistor TR5. The base and the collector of the transistor TR7 are short-circuited.

The collector of the transistor TR8 is connected to the negative power source 45 via the constant current source C2. A base of the transistor TR8 is connected to the base of the transistor TR6. The base and the collector of the transistor TR8 are short-circuited.

The collector of the transistor TR5 is connected to the positive power source 44 via the resistor R5. Further, the collector of the transistor TR5 is connected to a base of a transistor TR9 forming the subsequent stage amplifying circuit 20.

The collector of the transistor TR6 is connected to the negative power source 45 via the resistor R6. Further, the collector of the transistor TR6 is connected to a base of a transistor TR10 forming the subsequent stage amplifying circuit 20.

{Subsequent Stage Amplifying Circuit 20}

A configuration of the subsequent stage amplifying circuit 20 will be described below. The subsequent stage amplifying circuit 20 includes the transistors TR9 and TR10, and resistors R7 to R10.

The transistor TR9 forms an emitter grounding amplifier circuit whose input is the first stage amplification positive component 63A. A collector of the transistor TR9 is connected to the buffer circuit 30. The resistor R7 is an emitter resistor of the transistor TR9. The resistor R9 is a collector resistor of the transistor TR9.

The transistor TR10 forms an emitter grounding amplifier circuit whose input is the first stage amplification negative component 63B. A collector of the transistor TR10 is connected to the buffer circuit 30. The resistor R8 is an emitter resistor of the transistor TR10. The resistor R10 is a collector resistor of the transistor TR10.

Connection of the respective elements in the subsequent stage amplifying circuit 20 will be described. An emitter of the transistor TR9 is connected to the positive power source 44 via the resistor R7. The collector of the transistor TR9 is connected to one end of the resistor R9 and a base of a transistor TR11. The transistor TR11 forms the buffer circuit 30, as described later. The other end of the resistor R9 is grounded.

An emitter of the transistor TR10 is connected to the negative power source 45 via the resistor R8. The collector of the transistor TR10 is connected to one end of the resistor R10 and a base of a transistor TR12. The transistor TR12 forms the buffer circuit 30, as described later. The other end of the resistor R10 is grounded.

{Configuration of Buffer Circuit 30}

A configuration of the buffer circuit 30 will be described. The buffer circuit 30 includes the transistors TR11 and TR12, resistors R11 and R12, and a bias circuit 31.

The transistor TR11 forms an emitter follower circuit whose input is the subsequent stage amplification positive component 64A. The transistor TR12 forms an emitter follower circuit whose input is the subsequent stage amplification negative component 64B. The bias circuit 31 applies a bias voltage to bases of the transistors TR11 and TR12.

The base of the transistor TR11 is connected to the bias circuit 31 and the collector of the transistor TR9. A collector of the transistor TR11 is connected to the positive power source 44. An emitter of the transistor TR11 is connected to the output terminal 43 via the resistor R11.

A base of the transistor TR12 is connected to the bias circuit 31 and the collector of the transistor TR10. A collector of the transistor TR12 is connected to the negative power source 45. An emitter of the transistor TR12 is connected to the output terminal 43 via the resistor R12.

{Configuration of Feedback Circuit 50}

The feedback circuit 50 is an external circuit connected between the inverting input terminal 41 and the output terminal 43. When the amplifying circuit 1 is used, as shown in FIG. 1, it is assumed that the feedback circuit 50 is connected. The feedback circuit 50 has resistors RA and RB. One end of the resistor RA is connected to the output terminal 43. The other end of the resistor RA is connected to the inverting input terminal 41 and one end of the resistor RB. The other end of the resistor RB is grounded.

Operations of the amplifying circuit 1 in the first stage amplifying circuit 10 and the subsequent stage amplifying circuit 20 will be described separately.

{Operation of First Stage Amplifying Circuit 10}

In the first stage amplifying circuit 10, the input signals 61 and 62 are amplified by the transistors TR5 and TR6.

{Transistors TR5 and TR6}

The input signal 61 is input into the amplifying circuit 1 via the inverting input terminal 41. The positive component 61A of the input signal 61 is input into the emitter of the transistor TR5 via the transistor TR1 and the resistor R1. Therefore, the transistor TR5 viewed from the inverting input terminal 41 forms a base grounding amplifier circuit.

The input signal 62 is input into the amplifying circuit 1 via the non-inverting input terminal 42. The positive component 62A of the input signal 62 is input into the base of the transistor TR5 via the transistor TR3, the resistor R3 and the transistor TR7. Therefore, the transistor TR5 viewed from the non-inverting input terminal 42 forms an emitter grounding amplifier circuit.

As a result, the positive components 61A and 62A are amplified by the transistor TR5. The amplified signal is output as the first stage amplification positive component 63A from the first stage amplifying circuit 10. The first stage amplification positive component 63A is a signal obtained by amplifying the difference between the positive component 61A and the positive component 62A. A reason for amplifying the difference between the positive component 61A and the positive component 62A will be described in detail below.

Since the transistor TR5 amplifies the positive component 61A as the base grounding amplifier circuit, the positive component 61A and the amplified positive component 61A have the same phase. Since the transistor TR5 amplifies the positive component 62A as an emitter grounding amplifier circuit, the positive component 62A and the amplified positive component 62A have the opposite phases. Since the amplified positive component 61A and the amplified positive component 62A have the opposite phases, the first stage amplification positive component 63A is output as the signal obtained by amplifying the difference between the positive component 61A and the positive component 62A from the first stage amplifying circuit 10.

The transistor TR6 operates similarly to the transistor TR5. That is, the transistor TR6 as a base grounding amplifier circuit amplifies the negative component 61B. The transistor TR6 as an emitter grounding amplifier circuit amplifies the negative component 62B. The first stage amplification negative component 63B is output as the signal obtained by amplifying the difference between the negative component 61B and the negative component 62B from the first stage amplifying circuit 10 similarly to the first stage amplification positive component 63A. That is, the first stage amplifying circuit 10 operates as a differential amplifier circuit for amplifying the difference between the input signal 61 and the input signal 62.

[Transistors TR3 and TR4]

The transistors TR3 and TR4 form the emitter follower circuit whose input is the input signal 62 as described above. As a result, an input impedance on the side of the non-inverting input terminal 42 in the amplifying circuit 1 can be increased.

{Transistors TR1 and TR2}

The transistors TR1 and TR2 form the emitter follower circuits as described above. As a result, a fluctuation in a gain of the first stage amplifying circuit 10 according to the configuration of the feedback circuit 50 can be suppressed. A reason for being capable of suppressing the fluctuation in the gain of the first stage amplifying circuit 10 will be described by exemplifying the transistor TR1. An emitter internal resistor of the transistor TR5 is not taken into consideration.

As described above, the transistor TR5 operates as the base grounding amplifier circuit and the emitter grounding amplifier circuit. Therefore, amplification factors of the positive components 61A and 62A are determined by a ratio of the collector resistor and the emitter resistor (collector resistor/emitter resistor).

The feedback circuit 50 is connected between the inverting input terminal 41 and the output terminal 43. A resistor component (hereinafter, "resistor RF") of the feedback circuit 50 viewed from the transistor TR5 can be represented as a synthesized resistor of a parallel circuit including the resistor RA and the resistors RB.

A case where the amplifying circuit 1 does not have the transistor TR1 and the resistor R1 will be described. In this case, since the feedback circuit 50 is connected directly to the emitter of the transistor TR5, only the resistor RF is an emitter resistor of the transistor TR5. Therefore, the amplification factors of the positive components 61A and 62A in the transistor TR5 fluctuate according to a value of the resistor RF of the feedback circuit 50.

Similarly, when the amplifying circuit 1 does not have the transistor TR2 and the resistor R2, the amplification factors of the negative component 61B and 62B in the transistor TR6 fluctuate according to the resistor RF. That is, when the amplifying circuit 1 does not have the transistors TR1 and TR2 and the resistors R1 and R2, the gain of the first stage amplifying circuit 10 fluctuates according to a configuration of the feedback circuit 50.

As shown in FIG. 1, a case where the amplifying circuit 1 has the transistor TR1 and the resistor R1 will be described. In this case, as the emitter resistor of the transistor TR5, the resistor R1 and an output impedance of the emitter follower formed by the transistor TR1 should be taken into consideration. Concretely, the emitter resistor of the transistor TR5 is a synthesized resistor of a series circuit including the resistor R1 and the output impedance. The output impedance is denoted by Z1, Z1 is expressed by the following equation.

$$Z1 = RF \times (1/hfe\,(1))$$

Where, RF represents a resistance value of the resistor RF (a resistor component of the feedback circuit), and hfe(1) represents a direct current amplification factor of the transistor TR1.

When the value of hfe(1) is 100, the value of the resistor RF viewed from the transistor TR5 is 1/100 that is for a case without the transistor TR1. Further, the value of the resistor R1 is larger than Z1, in the emitter resistor of the transistor TR5, contribution of the resistor R1 is more dominant than contribution of the resistor RF. When the amplifying circuit 1 has the transistor TR1 and the resistor R1, the amplification factors of the positive components 61A and 62A in the transistor TR5 are prevented from fluctuating according to the configuration of the feedback circuit 50.

Similarly, when the amplifying circuit 1 has the transistor TR2 and the resistor R2, the amplification factors of the negative components 61B and 62B in the transistor TR6 are prevented from fluctuating according to the configuration of the feedback circuit 50. Even if the amplifying circuit 1 does not have the resistors R1 and R2, an influence of the resistor RF in the emitter resistors of the transistors TR5 and TR6 can be prevented.

{Supply of Collector Current to the Transistors TR5 and TR6}

The transistor TR5 can receive a supply of the electric current from the positive power source 44 via the resistor R5. The transistor TR6 can receive a supply of the electric current from the negative power source 45 via the resistor R6. That is, the transistors TR5 and TR6 can apply a large amount of electric current to the collectors in comparison with transistors forming a conventional differential amplifier circuit. Since the upper limits of the collector currents of the transistors TR5 and TR6 are mitigated, the first stage amplifying circuit 10 can amplify the input signals 61 and 62 without limiting its operation.

A reason for being capable of supplying a large amount of electric current to the collector will be described by exemplifying the transistor TR5. As shown in FIG. 1, the collector of the transistor TR5 is connected to the positive power source 44 via the resistor R5, and the collector of the transistor TR7 is connected to the positive power source 44 via the constant current source Cl. That is, since the transistors TR5 and TR7 do not form a current mirror circuit, the upper limit of the emitter current of the transistor TR5 is determined based on the electric potential of the positive power source 44 and the resistance value of the resistor R5. The constant current source C1 is used for supplying a bias current to the transistor TR5. As a result, the upper limit value of the collector current of the transistor TR5 increases more greatly than an upper limit value of a collector current of the transistors forming a conventional differential amplifier circuit.

When the upper limit value of the collector current of the transistor TR5 increases greatly, distortion of the first stage amplification positive component 63A can be prevented. A reason for being capable of preventing the distortion of the waveform of a first stage amplification positive component 63 will be described below.

Amplification of the positive component 62A in the case where the electric potential of the inverting input terminal 41 is fixed will be considered. In this case, an emitter potential of the transistor TR1 becomes a fixed potential that does not fluctuate. When the input signal 62 is input into the non-inverting input terminal 42 in a state that the emitter potential of the transistor TR1 is fixed, a base potential of the transistor TR5 changes according to the positive component 62A. A potential difference generated in the resistor R1 changes according to a change in the base potential of the transistor TR5 similarly to a normal emitter grounding amplifier circuit.

The electric current flowing in the resistor R1 (hereinafter, "electric current CR1" for convenience) changes according to the change in the potential difference generated in the resistor R1. Since the upper limit value of the collector current of the transistor TR5 increases greatly, the electric current CR1 changes without being distorted (without being clipped) according to the change in the potential difference of the resistor R1. The fluctuation in the collector potential of the transistor TR5 caused by the change in the electric current CR1 is output as the amplified positive component 62A.

Amplification of the positive component 61A of the input signal 61 in a case where the electric potential of the non-inverting input terminal 42 is fixed will be considered. In this case, the base potential of the transistor TR5 becomes a fixed electric potential that does not fluctuate. When the input signal 61 is input into the inverting input terminal 41 in a state that the base potential of the transistor TR5 is fixed, the potential difference of the resistor R1 changes according to the positive component 61A. That is, a potential difference (a base-to-base voltage) between the base of the transistor TR1 and the base of the transistor TR5 fluctuates according to the positive component 61A. The base-to-base voltage can be represented as a sum of VBE (base-to-emitter voltages) of the transistors TR1 and TR5 and the potential difference generated in the resistor R1. Since a fluctuation in VBE of the transistors TR1 and TR5 is much smaller than the fluctuation in the potential difference of the resistor R1, this fluctuation can be ignored.

The electric current CR1 changes according to the change in the potential difference generated in the resistor R1. Since the upper limit value of the collector current of the transistor TR5 greatly increases, the electric current CR1 changes without being distorted according to the change in the potential difference generated in the resistor R1. The fluctuation in the collector potential of the transistor TR5 caused by the change in the electric current CR1 is output as the amplified positive component 61A.

When the electric current according to the resistance value of the resistor R5 is supplied from the positive power source 44, the electric current CR1 (the collector current of the transistor TR5) can be changed according to changes in the positive components 61A and 62A. Therefore, the first stage amplification positive component 63A without distortion can be output. Similarly, the electric current is supplied from the negative power source 45 to the transistor TR6, so that the first stage amplification negative component 63B without distortion can be output.

The amplification of the positive components 61A and 62A was described on the premise that the resistor R1 was connected between the emitters of the transistor TR1 and the transistor TR5. However, even if the first stage amplifying circuit 10 does not have the resistors R1 and R2, the transistors TR5 and TR6 can amplify the input signals 61 and 62.

In this case, since VBE of the transistors TR1 and TR5 fluctuates according to the changes in the positive components 61A and 62A, an amplitude of the fluctuation in the emitter current is larger than the case where the resistor R1 is connected. In this case, the resistance value of the resistor R5 is adjusted so that the gain of the transistor TR5 may be adjusted.

{Influence of Temperature Property of Transistor}

The provision of the resistors R1 and R2 to the amplifying circuit 1 can suppress the fluctuation in the gain of the first stage amplifying circuit 10 caused due to the temperature properties of the transistors TR5 and TR6, and further can improve the linearity of the amplification. A reason for this will be described below by exemplifying the transistor TR5. It is assumed that the resistor component of the feedback circuit 50 does not influence the gain of the first stage amplifying circuit 10.

In general, in order to increase the gain of the first stage amplifying circuit 10 as much as possible, the resistor R1 is not connected to the emitter of the transistor TR5. In this case, the amplification factors of the positive components 61A and 62A are determined by a ratio of the resistor R5 and the emitter internal resistor. When the emitter internal resistor fluctuates according to a temperature, the amplification factors fluctuate according to the temperature. That is, when the resistor R1 is not connected to the emitter of the transistor TR5, the gain of the first stage amplifying circuit 10 fluctuates according to the temperature.

However, in the amplifying circuit 1, the resistor R1 is connected to the emitter of the transistor TR5. The emitter resistor of the transistor TR5 is a synthesized resistor at the time when the emitter internal resistor and the resistor R1 are connected in series. For this reason, even if the emitter internal resistor fluctuates, a fluctuation width of all the emitter resistors becomes small. The same is true for the transistor TR6. When the resistors R1 and R2 are connected to the emitters of the transistors TR5 and TR6, the fluctuation in the amplification factors according to the temperature is suppressed. Therefore, the fluctuation in the gain of the first stage amplifying circuit 10 can be suppressed.

It is desirable that the resistance values of the resistors R1 and R2 are set so that a voltage drop of the resistors R1 and R2 is not less than the emitter-to-base voltage (0.6 to 0.7 V) of the transistors. As a result, the fluctuation in the amplification factors of the transistors TR5 and TR6 can be prevented. Further, when the ratios of the resistance values of the resistors R1 and R2 are adjusted, the electric potential of the inverting input terminal 41 can be adjusted. As a result, an output DC voltage of the amplifying circuit 1 can be adjusted.

{Operation of Suppression Circuit}

Figure 2:
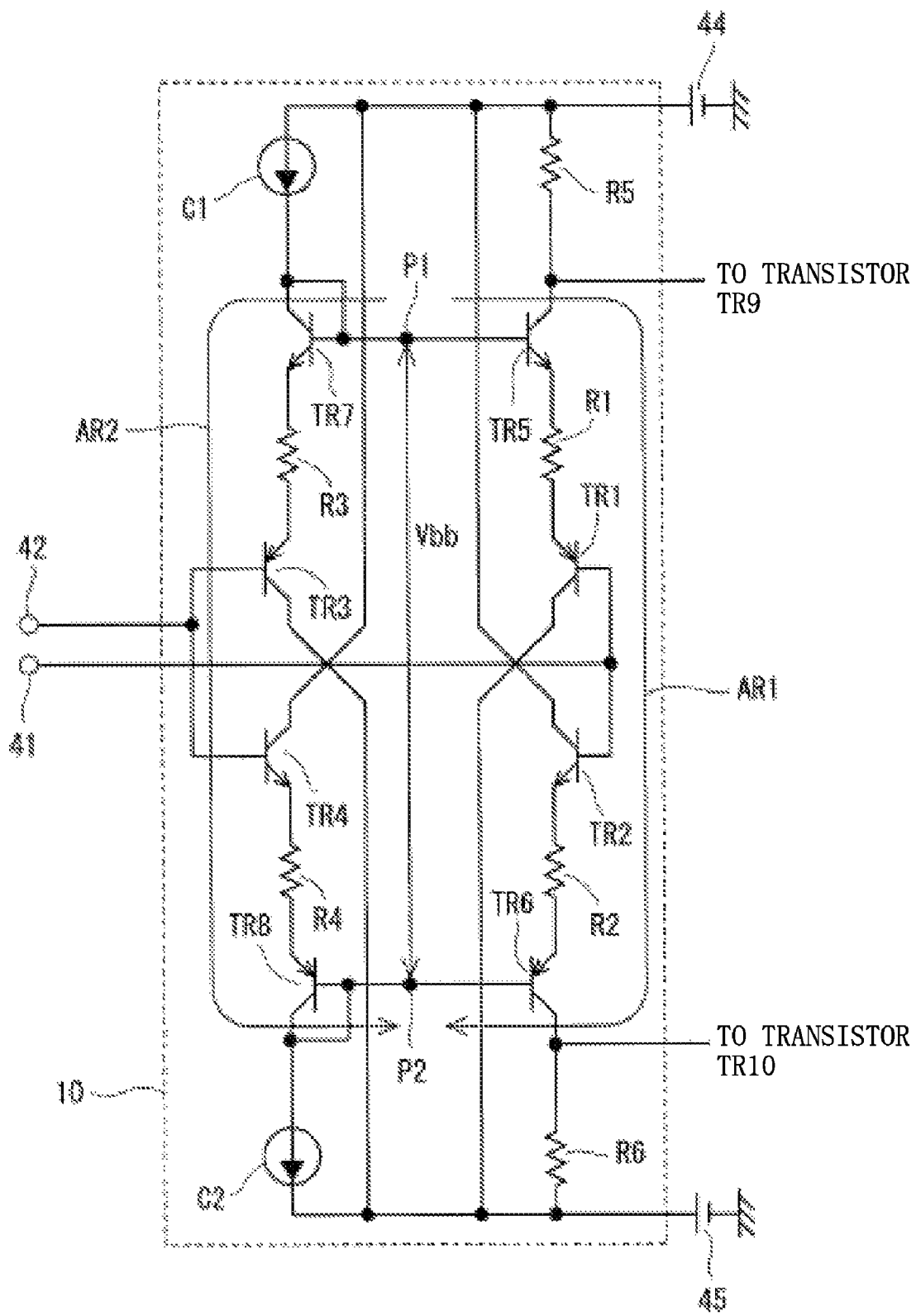
FIG. 2 is a diagram illustrating a signal path in a first stage amplifying circuit of the amplifying circuit.

An operation of the suppression circuit formed by the transistors TR7 and TR8, and the resistor R3 and R4 will be described below. FIG. 2 is a diagram illustrating a signal path from the base of the transistor TR5 to the base of the transistor TR6. With reference to FIG. 2, a differential potential Vbb is a potential difference between the base of the transistor TR5 and the base of the transistor TR6. The suppression circuit suppresses a fluctuation in the differential potential Vbb caused by the fluctuation in the temperature properties of the transistors. As a result, operating points of the transistors TR5 and TR6 can be stabilized.

In the first stage amplifying circuit 10, the bias currents of the transistors TR5 and TR6 are determined by an electric current flowing between the constant current source C1 and the constant current source C2. When the differential potential Vbb does not fluctuate, the bias currents of the transistors TR5 and TR6 become constant. That is, operating points of the transistors TR5 and TR6 do not change.

With reference to FIG. 2, one point between the base of the transistor TR5 and the base of the transistor TR7 is determined as a point P1. One point between the base of the transistor TR6 and the base of the transistor TR8 is determined as a point P2. Arrows AR1 and AR2 shown in FIG. 2 show signal paths from the point P1 to P2.

Since the emitter internal resistor changes according to the temperature, VBE (base-to-emitter voltage) also fluctuates according to the temperature. In the first path shown by the arrow AR1, VBEs of the transistors TR1, TR2, TR5 and TR6 fluctuate according to the temperature. In the second path shown by the arrow AR2, VBEs of the transistors TR3, TR4, TR7 and TR8 fluctuate according to the temperature. Since the transistors TR7 and TR8 are present in the second path, the number of the transistors matches with each other in the first path and the second path. As a result, the differential potential Vbb that passes through the first path and the differential potential Vbb that passes through the second path change similarly. Therefore, since the differential potential Vbb becomes constant regardless of the temperature, the operating points of the transistors TR5 and TR6 can be prevented from fluctuating.

The differential potential Vbb can be changed by adjusting the resistance values of the resistors R1 to R4. When the resistance values are increased, the differential potential Vbb can be increased. In this case, since the contribution of VBEs of the transistors TR1 to TR8 with respect to the differential potential Vbb is relatively reduced, a variation in VBEs of the transistors can reduce the influence to be exerted on the differential potential Vbb.

{Operation of Subsequent Stage Amplifying Circuit 20}

With reference to FIG. 1, in the subsequent stage amplifying circuit 20, the transistors TR9 and TR10 each form the emitter grounding amplifier circuit. When it is considered that the amplification factor of the amplifying circuit 1 is increased, it is desirable that the subsequent stage amplifying circuit 20 does not have the resistor R9.

However, when the collectors of the transistors TR9 and TR10 are grounded respectively via the resistors R9 and R10, a gain of the subsequent stage amplifying circuit 20 can be prevented from fluctuating according to the configuration of the feedback circuit 50. The transistor TR9 will be described in detail as an example.

With reference to FIG. 1, the resistor R7 is the emitter resistor of the transistor TR9. A collector resistor of the transistor TR9 is represented by a synthesized resistor of a parallel circuit in which the resistor R9, the collector internal resistor of the transistor TR9, and the output resistor are connected in parallel. The output admittance of the transistor TR9 is represented by hoe (9), the collector internal resistor is expressed by (1/hoe (9)). The output resistor is the collector resistor of the transistor TR9, and corresponds to the output impedance of the emitter grounding amplifier circuit formed by the transistor TR9.

The collector of the transistor TR9 is grounded via the transistor TR11, the resistors R11, RA and RB. When the resistance value of the output resistor is represented by Ro, Ro is expressed by the following equation.

$$Ro = hfe(11) \times (R11 + (RA + RB))$$

Where, hfe(11) represents a direct current amplification factor of the transistor TR11, and R11, RA and RB represent resistance values of the resistors R11, RB and RA.

It is assumed that the resistance value of the resistor R9 is much smaller than the collector internal resistor of the transistor TR9, namely, (R9<<1/hoe(9)), and the resistance value of the resistor R9 is much smaller than Ro (R9<<Ro). This case is considered. In this case, contribution of the resistor R9 is dominant in the output resistor. On the other hand, the contribution of the resistors RA and RB in the feedback circuit 50 is reduced in the output resistor. The same is true for the transistor TR10 for amplifying the first stage amplification negative component 63B.

A case where the resistor R9 is not connected to the collector of the transistor TR9 is considered. When the output resistor is smaller than the collector internal resistor (Ro<1/hoe(9)), the resistors RA and RB are dominant in the output resistor of the transistor TR9. That is, the gain of the subsequent stage amplifying circuit 20 fluctuates due to the resistance values of the resistor RA and the resistors RB. However, when the subsequent stage amplifying circuit 20 has the resistors R9 and R10, the resistors RA and RB of the feedback circuit 50 can suppress the influence to be exerted on the gain of the subsequent stage amplifying circuit 20.

{Modified Examples}

Modified examples of the embodiment will be described below. In the above description, the collectors of the transistors TR1 and TR3 are connected to the negative power source 45, and the collectors of the transistors TR2 and TR4 are connected to the positive power source 44 in the amplifying circuit 1. However, the connection of the collectors of the transistors TR1 to TR4 is not limited to this.

Figure 3:
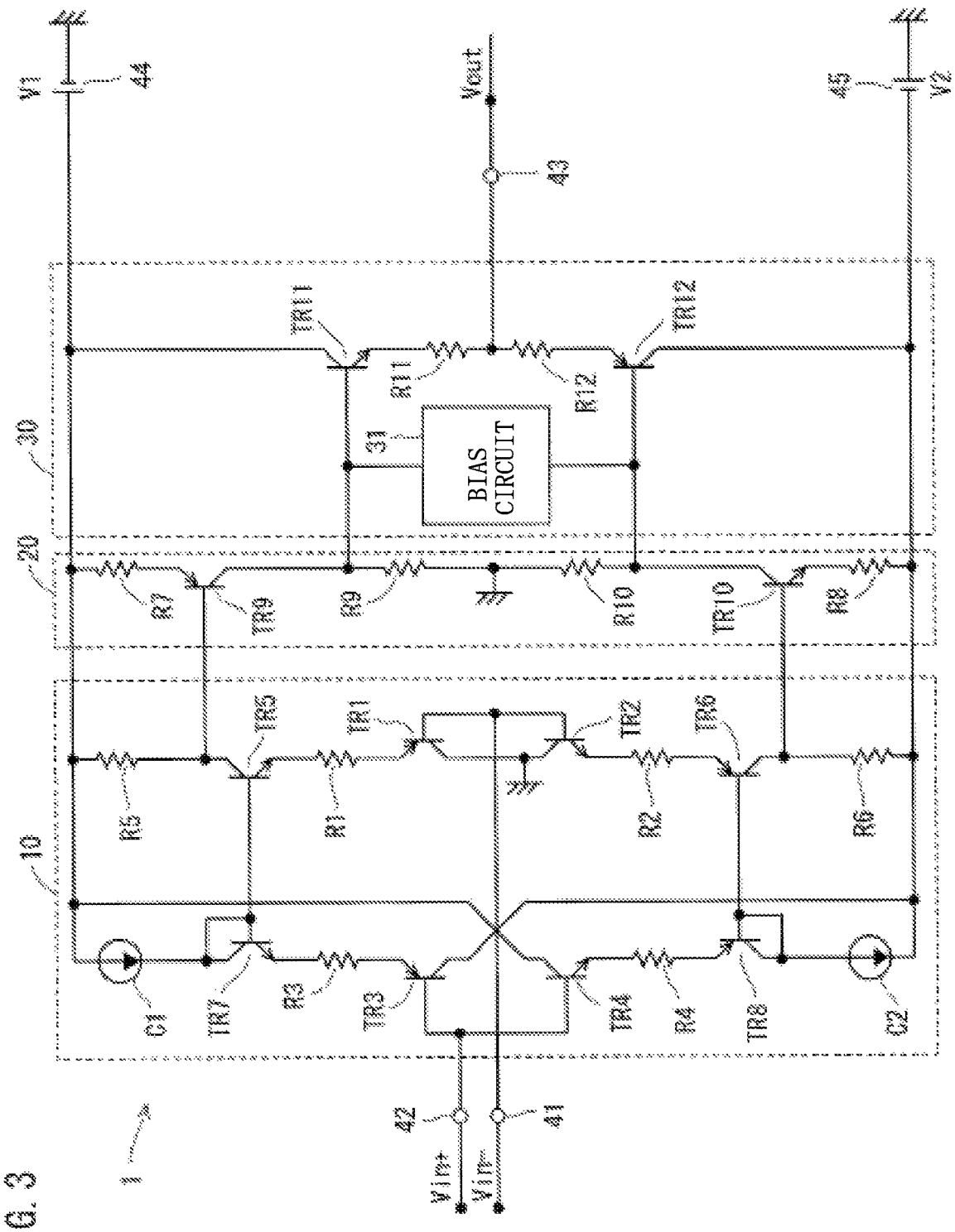
FIG. 3 is a circuit diagram illustrating the amplifying circuit according to a modified example.

FIG. 3 is a circuit diagram illustrating a first modified example of the amplifying circuit 1. With reference to FIG. 3, in the first modified example, the collectors of the transistors TR1 and TR2 are grounded. As a result, a power loss of the transistors TR1 and TR2 can be reduced.

Figure 4:
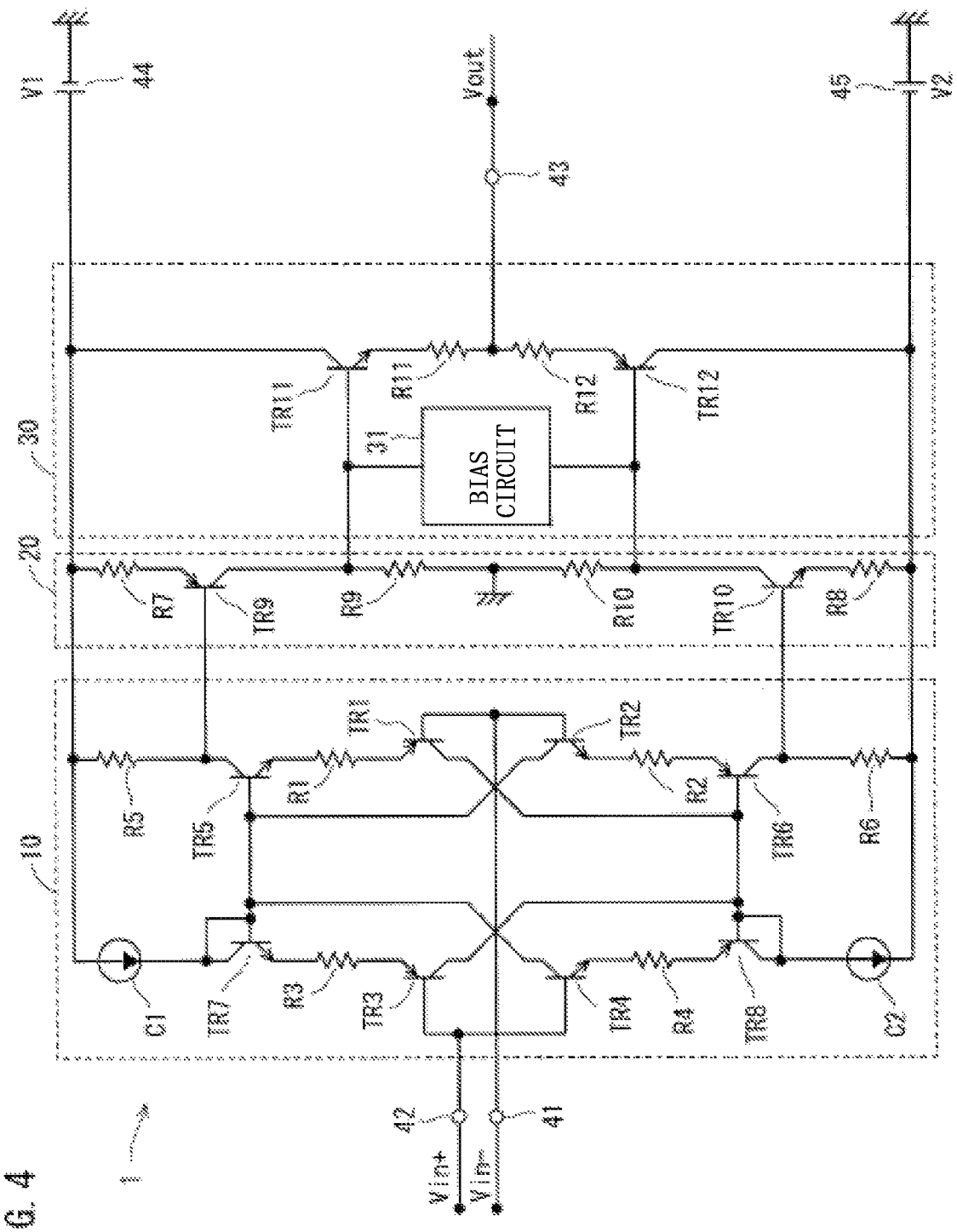
FIG. 4 is a circuit diagram illustrating the amplifying circuit according to a modified example.

FIG. 4 is a circuit diagram illustrating a second modified example of the amplifying circuit 1. With reference to FIG. 4, in the second modified example, the collectors of the transistors TR1 and TR3 are connected to the base of the transistor TR6. Since the base potential of the transistor TR6 is higher than the electric potential of the negative power source 45, the power loss of the transistors TR2 and TR4 can be reduced.

The collectors of the transistors TR2 and TR4 are connected to the base of the transistor TR5. Since the base potential of the transistor TR5 is lower than the electric potential of the positive power source 44, the power loss of the transistors TR2 and TR4 can be reduced. As shown in FIG. 4, when the collectors of the transistors TR1 to TR4 are connected, an influence of collector capacitances Cob of the transistors TR1 to TR4 can be reduced.

Figure 5:
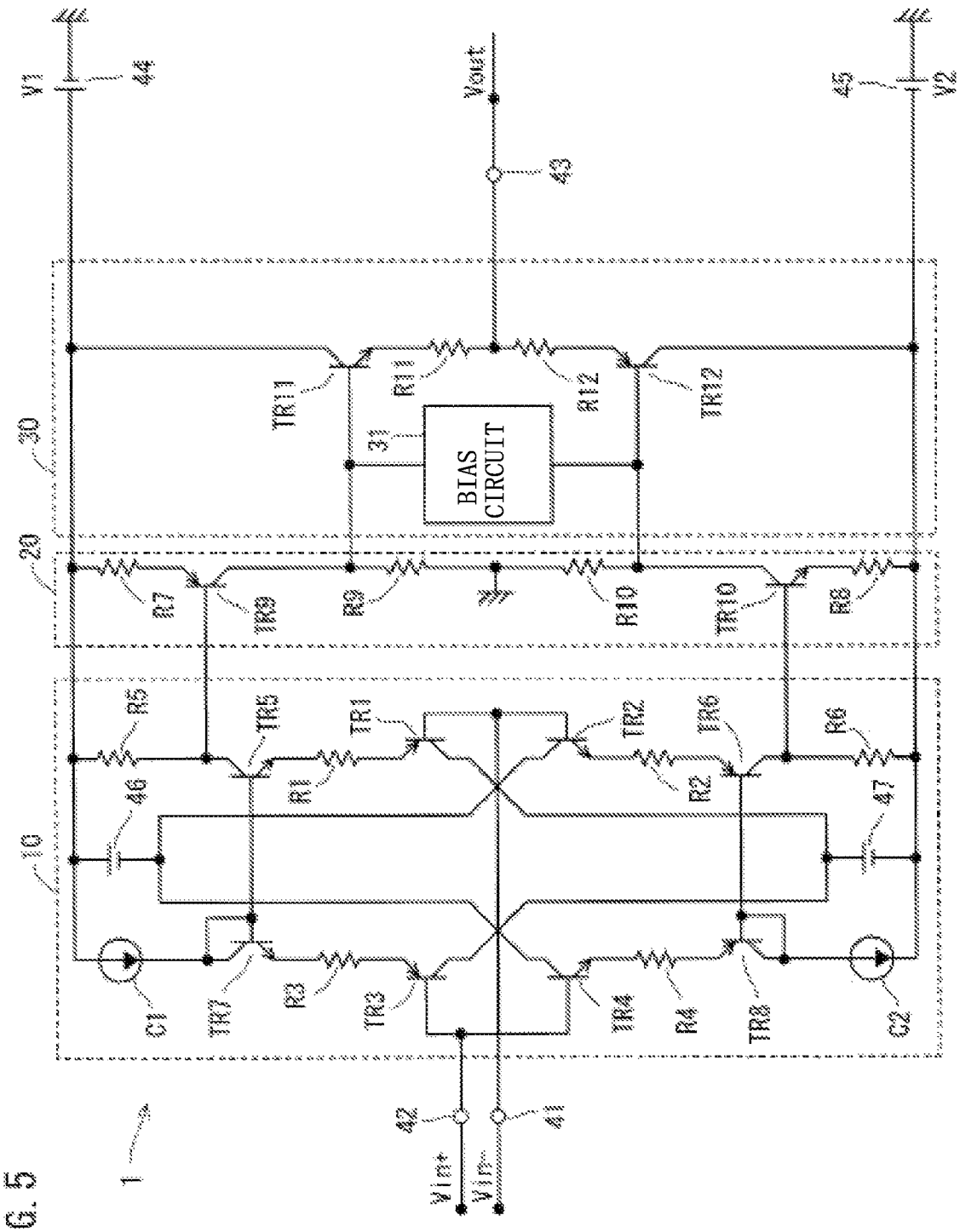
FIG. 5 is a circuit diagram illustrating the amplifying circuit according to a modified example.

FIG. 5 is a circuit diagram illustrating a third modified example of the amplifying circuit 1. With reference to FIG. 5, the collectors of the transistors TR1 and TR3 are connected to a constant power source 47. An electric potential of the constant power source 47 is higher than the electric potential of the negative power source 45. Therefore, the power loss of the transistors TR1 and TR3 can be reduced. The collectors of the transistors TR2 and TR4 are connected to a constant power source 46. An electric potential of the constant power source 46 is lower than the electric potential of the positive power source 44. Therefore, the power loss of the transistors TR2 and TR4 can be reduced.

The amplifying circuit 1 may have the circuit configuration shown in FIG. 6 to FIG. 11.

Figure 6:
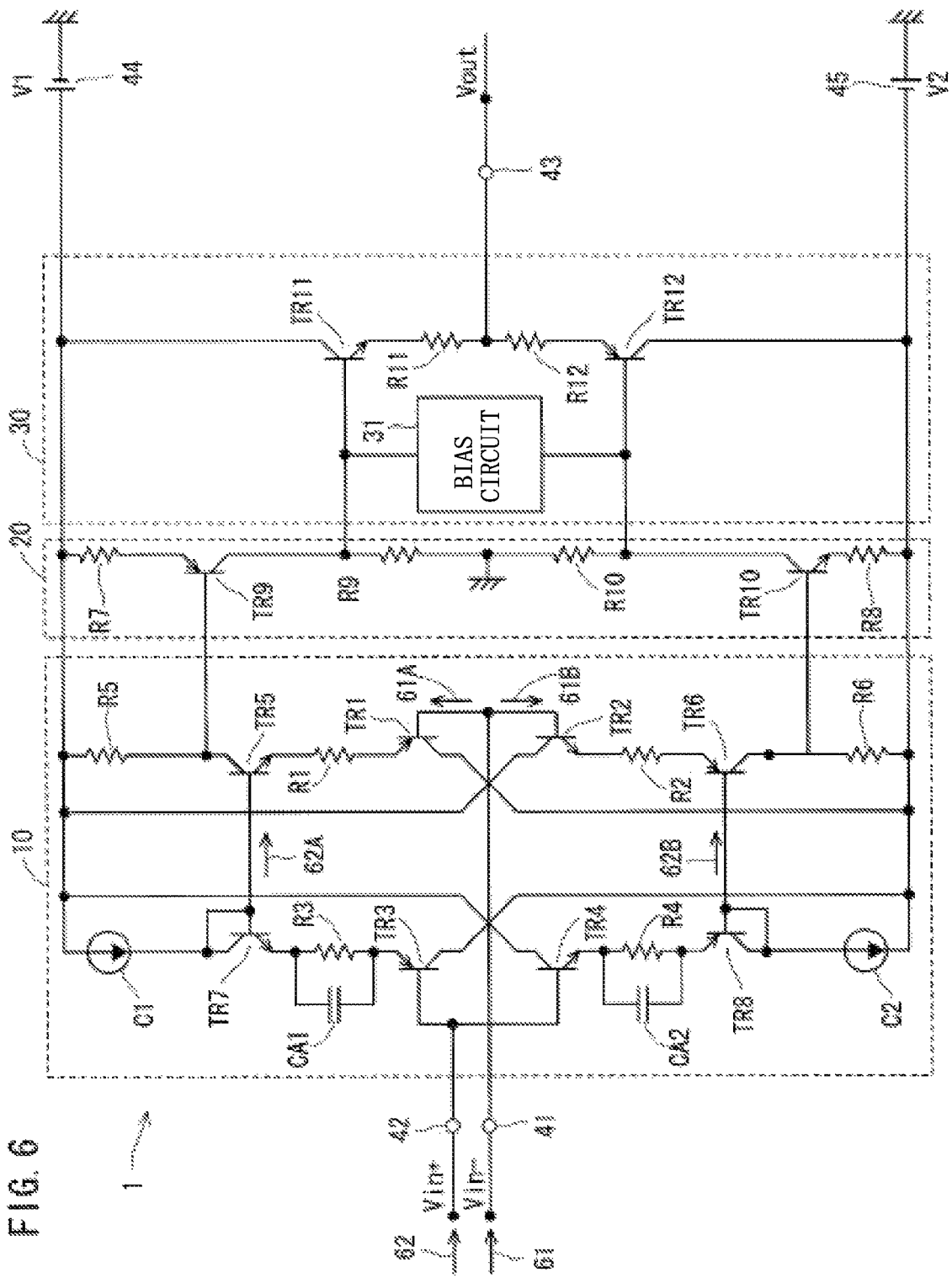
FIG. 6 is a circuit diagram illustrating the amplifying circuit according to a modified example.

FIG. 6 is a diagram illustrating a fourth modified example of the amplifying circuit 1. With reference to FIG. 6, a capacitor CA1 is connected between the emitter of the transistor TR3 and the emitter of the transistor TR7. The capacitor CA1 and the resistor R3 are connected in parallel. A capacitor CA2 is connected between the emitter of the transistor TR4 and the emitter of the transistor TR8. The capacitor CA1 and the resistor R4 are connected in parallel. As a result, the frequency property of the first stage amplifying circuit 10 can be improved.

The reason for this will be described below by exemplifying operations of the resistor R3, the transistor TR5 and the capacitor CA1. The following description is applied also to the resistor R4, the transistor TR6 and the capacitor CA2.

A resistor component from the non-inverting input terminal 42 through the base of the transistor TR5 and the collector capacitance Cob of the transistor TR5 form a low-pass filter. The low-pass filter attenuates a high-frequency component of the positive component 62A input from the non-inverting input terminal 42. On the other hand, a high-frequency component of the positive component 61A input from the inverting input terminal 41 is not influenced by the collector capacitance Cob of the transistor TR5, and thus is not attenuated. Although the positive component 62A is attenuated, the positive component 61A is not attenuated. For this reason, a common mode rejection ratio in the first stage amplifying circuit 10 is deteriorated in a high-frequency region.

In the resistor component from the non-inverting input terminal 42 to the base of the transistor TR5, the contribution of the resistor R3 is dominant. However, as described above, the resistors R1 to R4 are provided in order to adjust the differential potential Vbb, and thus the resistor R3 cannot be removed. When the capacitor CA1 that is connected to the resistor R3 in parallel is provided, the positive component 62A is input into the transistor TR5 without via the resistor R3. In the above low-pass filter, since the resistor R3 does not contribute as a resistor component, a cut-off frequency of the low-pass filter can be increased. As a result, the high-frequency property in the first stage amplifying circuit 10 and the common mode rejection ratio can be improved.

Figure 7:
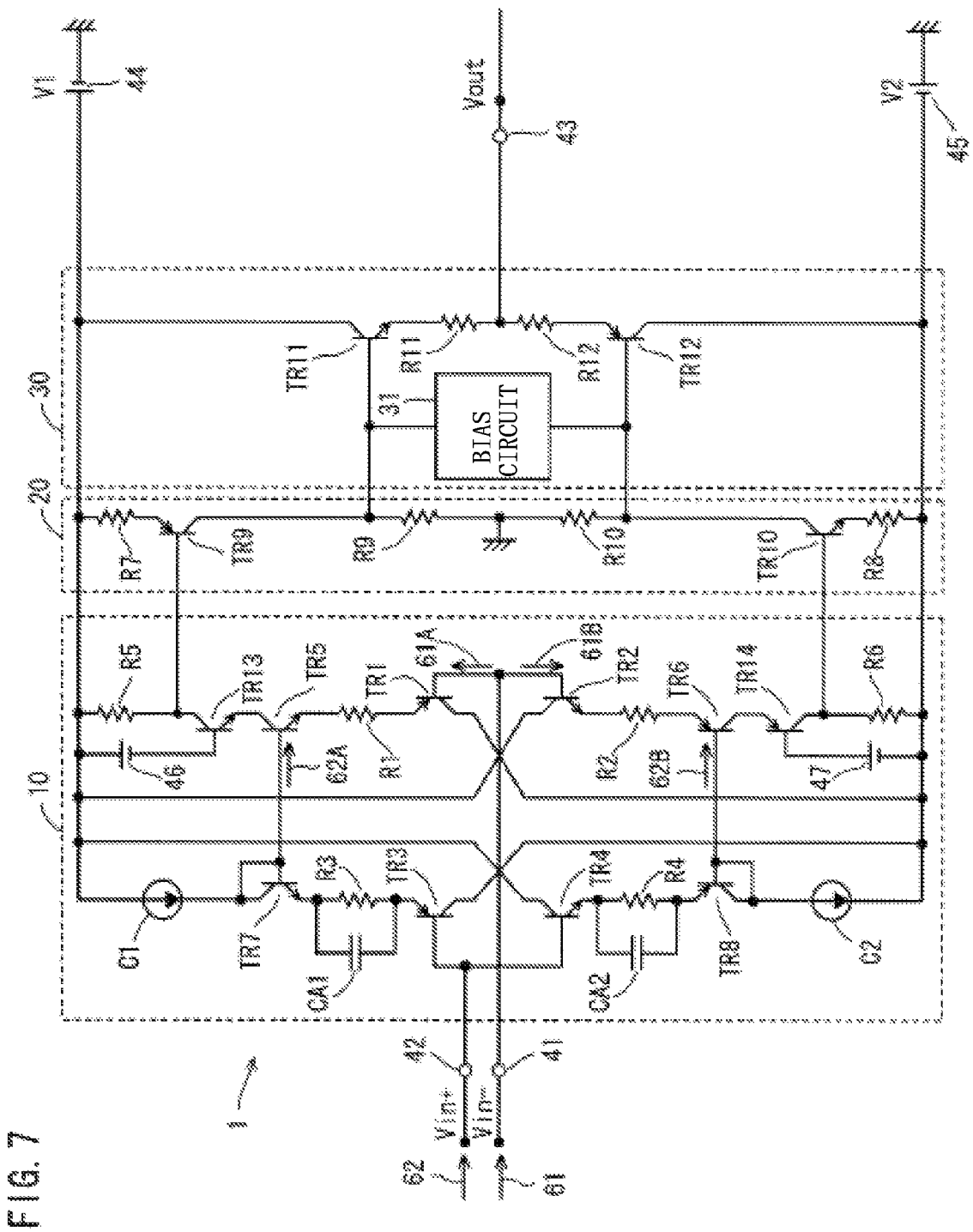
FIG. 7 is a circuit diagram illustrating the amplifying circuit according to a modified example.

FIG. 7 is a diagram illustrating a fifth modified example of the amplifying circuit 1. With reference to FIG. 7, the transistor TR5 as well as a transistor TR13 forms a cascode circuit. The transistor TR6 as well as a transistor TR14 forms a cascode circuit. As a result, an influence of a mirror effect generated in the transistors TR5 and TR6 can be reduced.

Concretely, the base of the transistor TR13 is connected to the constant power source 46. The emitter of the transistor TR13 is connected to the collector of the transistor TR5. The collector of the transistor TR13 is connected to one end of the resistor R5 and the base of the transistor TR9. A base of the transistor TR14 is connected to the constant power source 47. An emitter of the transistor TR14 is connected to the collector of the transistor TR6. A collector of a transistor TR15 is connected to one end of the resistor R6 and the base of the transistor TR10. Since the positive component 62A is amplified by the emitter grounding amplifier circuit formed by the transistor TR5, the high-frequency property of the first stage amplifying circuit 10 is deteriorated by the mirror effect of the transistor TR5. However, the transistors TR5 and TR13 form a cascode circuit, so that a mirror effect of the transistor TR5 is suppressed. Similarly, the transistors TR6 and TR14 form a cascode circuit, so that a mirror effect of the transistor TR6 is suppressed. As a result, the high-frequency property of the first stage amplifying circuit 10 can be improved, and a slew rate of the first stage amplifying circuit 10 can be improved.

In the first stage amplifying circuit 10 shown in FIG. 7, the capacitors CA1 and CA2 do not have to be provided. Even in this case, since the influence of the mirror effect in the transistors TR5 and TR6 can be reduced, the high-frequency property and the slew rate of the first stage amplifying circuit 10 can be improved.

Figure 8:
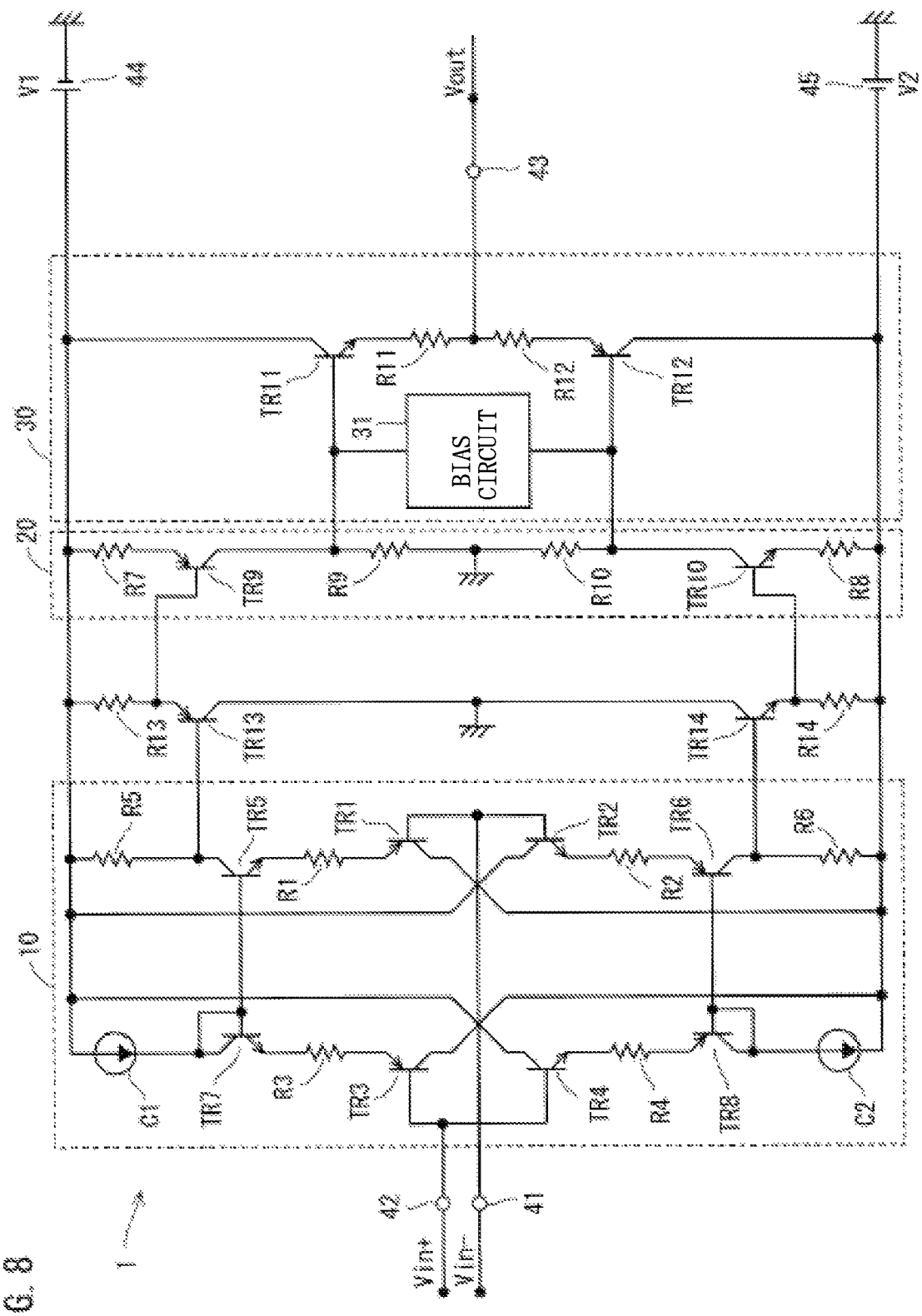
FIG. 8 is a circuit diagram illustrating the amplifying circuit according to a modified example.

FIG. 8 is a circuit diagram illustrating a sixth modified example of the amplifying circuit 1. With reference to FIG. 8, the emitter follower circuit is connected between the first stage amplifying circuit 10 and the subsequent stage amplifying circuit 20.

Concretely, the base of the transistor TR13 is connected to the collector of the transistor TR5. The emitter of the transistor TR13 is connected to the other end of the resistor R13 and the base of the transistor TR9. The other end of the resistor R13 is connected to the positive power source 44. The collector of the transistor TR13 is grounded.

The base of the transistor TR14 is connected to the collector of the transistor TR6. The emitter of the transistor TR14 is connected to one end of a resistor R14 and the base of the transistor TR10. The other end of the resistor R14 is connected to the negative power source 45. A collector of the transistor TR14 is grounded. As a result, a frequency property of the subsequent stage amplifying circuit 20 can be improved.

Figure 9:
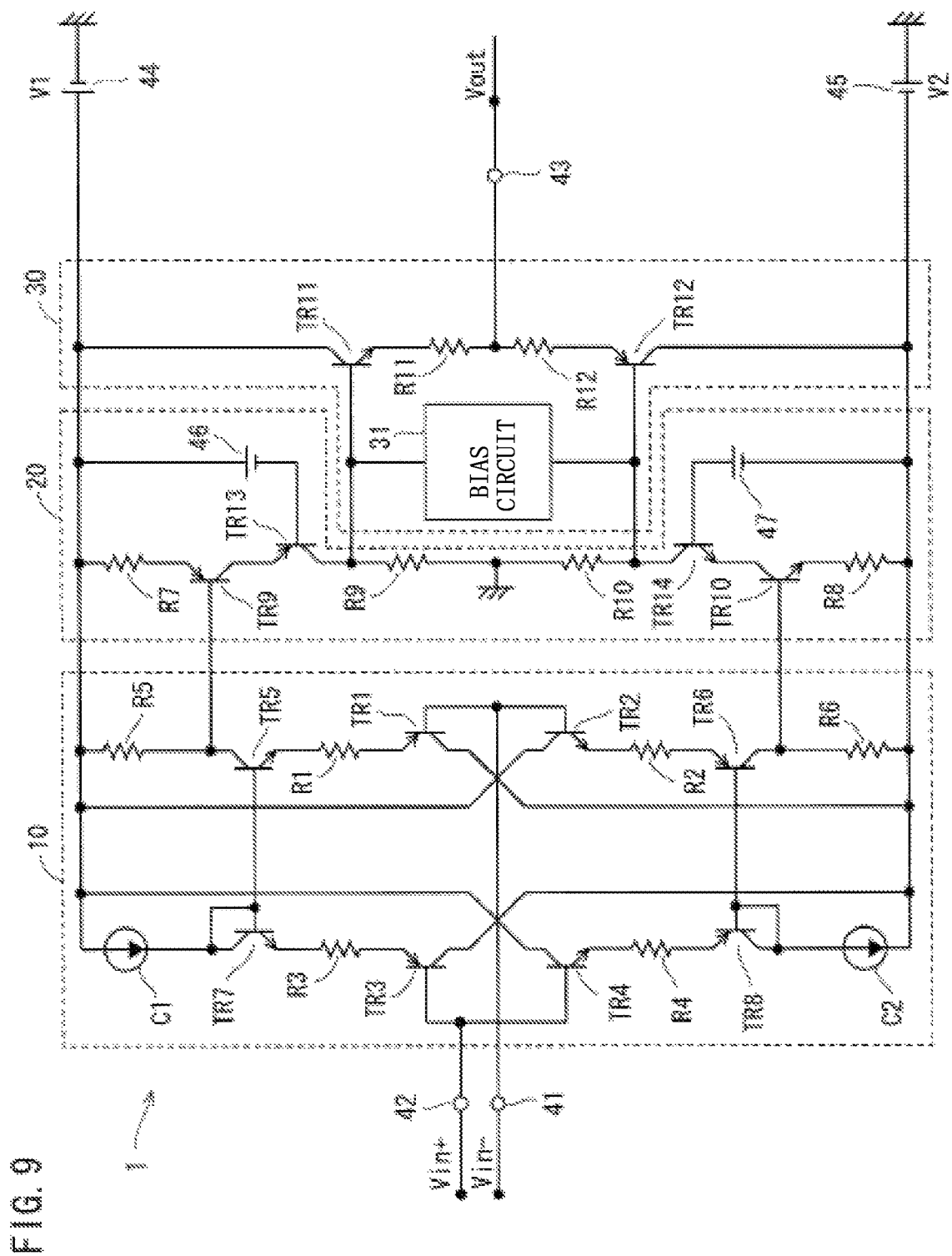
FIG. 9 is a circuit diagram illustrating the amplifying circuit according to a modified example.

FIG. 9 is a circuit diagram illustrating a seventh modified example of the amplifying circuit 1. With reference to FIG. 9, in the subsequent stage amplifying circuit 20, the transistors TR9 and TR13 form a cascode circuit. The transistors TR10 and 14 form a cascode circuit.

Concretely, the emitter of the transistor TR13 is connected to the collector of the transistor TR9. The collector of the transistor TR13 is connected to one end of the resistor R9 and the base of the transistor TR11. The base of the transistor TR13 is connected to the constant power source 46.

An emitter of a transistor TR18 is connected to the collector of the transistor TR10. A collector of the transistor TR18 is connected to one end of the resistor R10 and the base of the transistor TR12. A base of the transistor TR18 is connected to the constant power source 47.

Addition of a cascode circuit can reduce the power loss of the transistors TR9 and TR10. Since the mirror effect is not produced, the frequency property of the subsequent stage amplifying circuit 20 can be improved.

Figure 10:
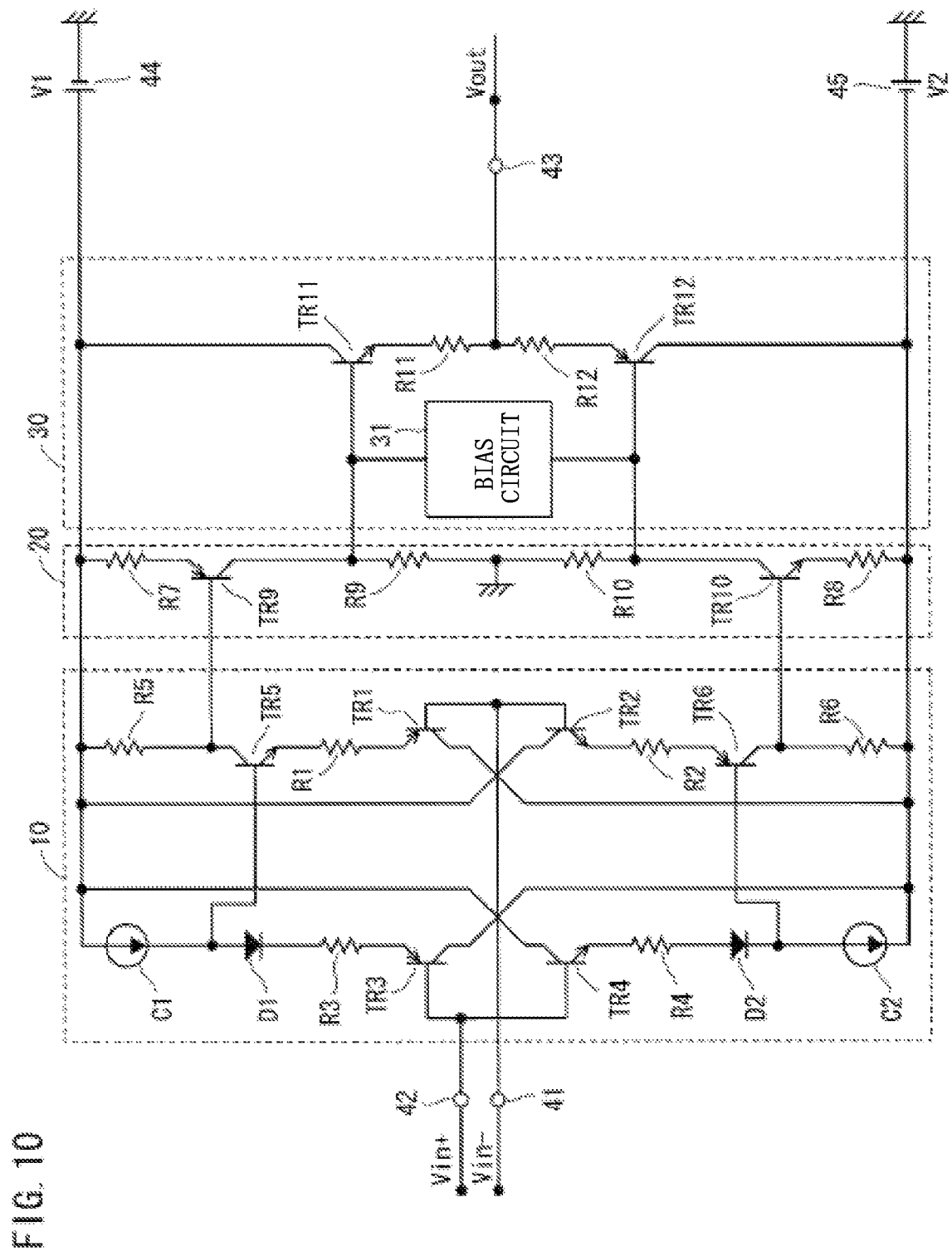
FIG. 10 is a circuit diagram illustrating the amplifying circuit according to a modified example.

FIG. 10 is a circuit diagram illustrating an eighth modified example of the amplifying circuit 1. With reference to FIG. 10, the first stage amplifying circuit 10 has diodes D1 and D2 instead of the transistors TR7 and TR8.

An anode of the diode D1 is connected to one end of the constant current source C1 and the base of the transistor TR5. A cathode of the diode D1 is connected to the resistor R3. A cathode of the diode D2 is connected to one end of the constant current source C2 and the base of the transistor TR6. An anode of the diode D1 is connected to the resistor R3. A temperature property of a voltage drop of the diode is the same as the temperature property of VBEs of the transistors. For this reason, also in the circuit configuration of FIG. 10, the fluctuation in the differential potential Vbb can be suppressed.

Figure 11:
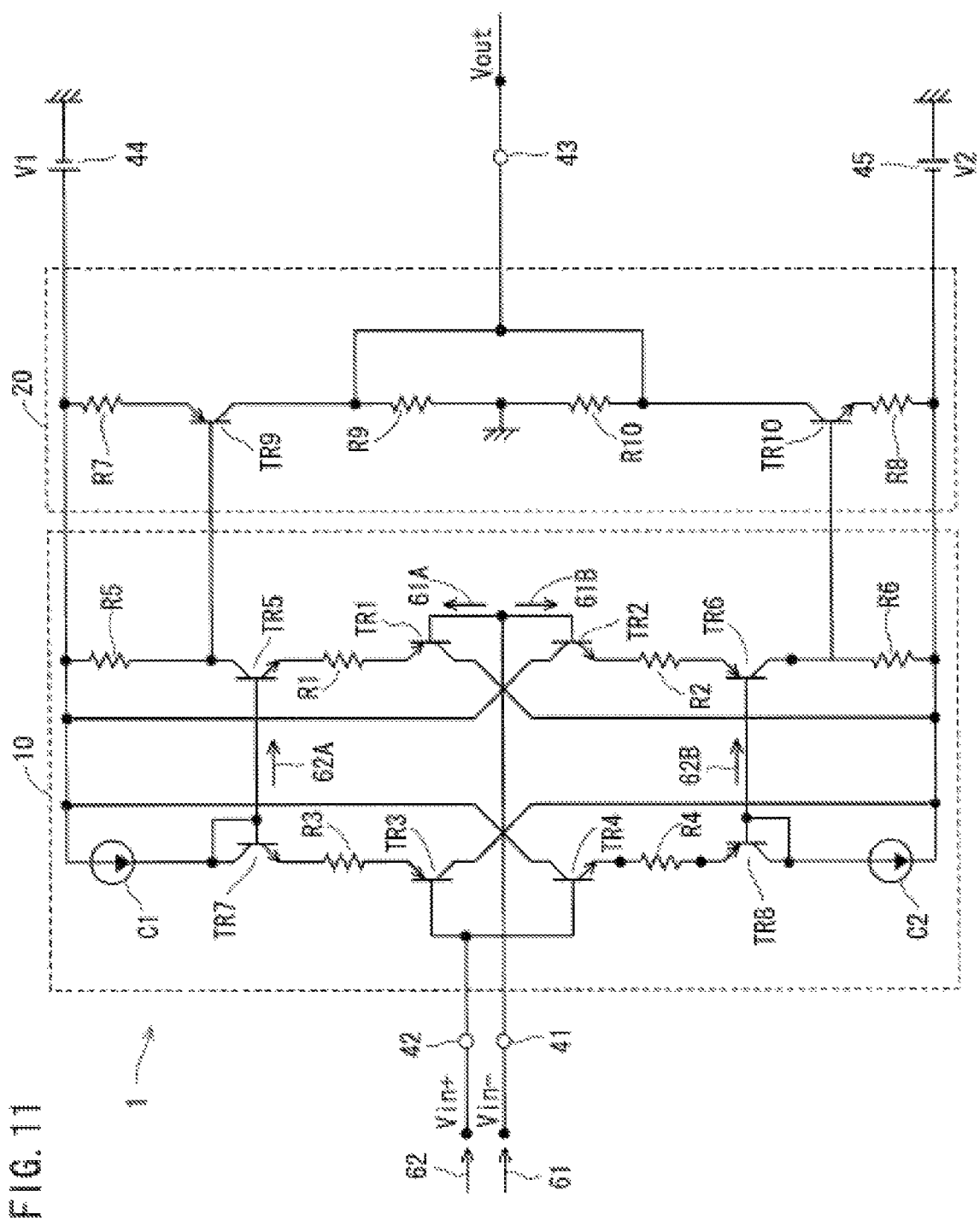
FIG. 11 is a circuit diagram illustrating the amplifying circuit according to a modified example.

FIG. 11 is a circuit diagram illustrating a ninth modified example of the amplifying circuit 1. With reference to FIG. 11, the amplifying circuit 1 does not have to include the buffer circuit 30. In this case, the collector of the transistor TR9 is connected to one end of the resistor R9 and the output terminal 43. The collector of the transistor TR10 is connected to one end of the resistor R10 and the output terminal 43. In this case, the output impedance of the amplifying circuit 1 is higher than the case where the buffer circuit 30 is provided.

When the amplifying circuit 1 shown in FIG. 11 is used, the resistances of the circuit elements (hereinafter, called as output-side elements) to be connected to the output terminal 43 are desirably higher than the resistance values of the resistors R9 and R10. The output resistor of the transistor TR9 is a synthesized resistor of a parallel circuit including the resistor R9 and the output-side element. When the resistance value of the output-side element is higher than the resistance value of the resistor R9, the contribution of the resistor R9 is dominant in the output resistor. That is, the gain of the emitter grounding amplifier circuit formed by the transistor TR9 can be prevented from fluctuating due to the resistance value of the output-side element. The same is true for an emitter grounding amplifier circuit configured by the transistor TR10. As a result, the gain of the subsequent stage amplifying circuit 20 can be prevented from fluctuating by the output-side element.

In the above embodiment, the description has been given of the amplifying circuit 1 having the first stage amplifying circuit 10 as the example, but only the first stage amplifying circuit 10 may be used to amplify the input signals 61 and 62.

Figure 12:
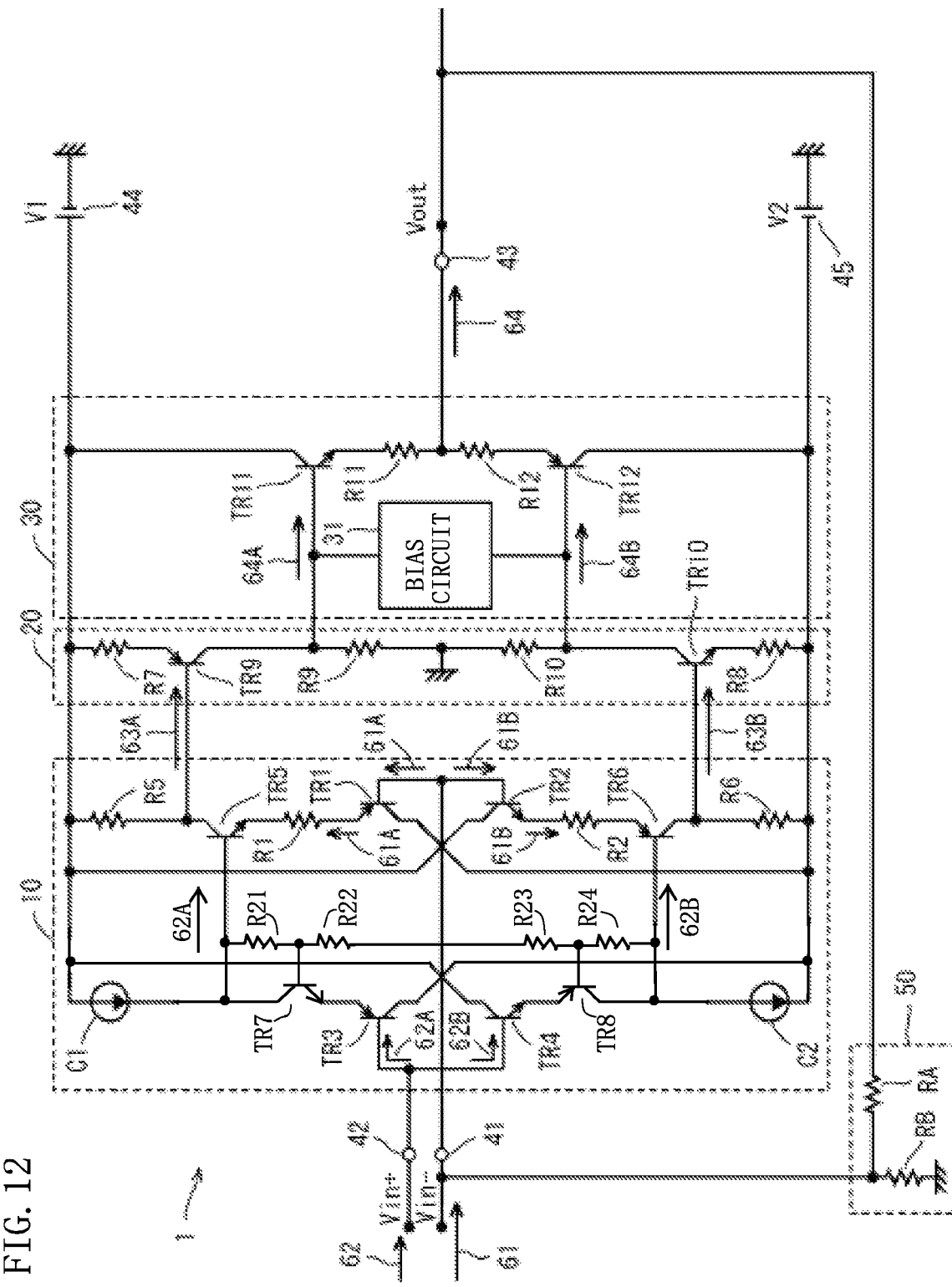
FIG. 12 is a circuit diagram illustrating the amplifying circuit according to a modified example.

FIG. 12 is a circuit diagram illustrating a tenth modified example of the amplifying circuit 1. Only a difference from FIG. 1 will be described, and description about the same portion will be omitted. The first stage amplifying circuit 10 includes the transistors TR1 to TR8, the resistors R1, R2, R5, R6 and R21 to R24, and the constant current sources C1 and C2. The transistors TR3, TR4, TR7 and TR8, and the resistors R21 to R22 form the constant voltage source.

The transistor TR7 is an NPN transistor. The emitter of the transistor TR7 is connected to an output of the emitter follower circuit of the transistor TR3. The transistor TR8 is a PNP transistor that is paired with the transistor TR7. The emitter of the transistor TR8 is connected to an output of the emitter follower circuit of the transistor TR4. The collector of the transistor TR7 is connected to the positive power source 44 via constant current source C1, and connected to a resistor 21 and the base of the transistor TR1. The base of the transistor TR7 is connected to a connecting point between the resistors R21 and R22. The collector of the transistor TR8 is connected to the negative power source 45 via the constant current source C2, and to the resistor R24 and the base of the transistor TR6, and the base of the transistor TR8 is connected to a connecting point between the resistors R23 and R24.

{Constant Voltage Source}

Thus, the transistors TR3, TR4, TR7 and TR8, the resistors R21 and R22 form the constant voltage source. A total voltage of the voltages Vbe between bases and the emitters of the transistors TR3, TR4, TR7 and TR8 (0.6 V×4=2.4 V) is generated on both ends of the resistors R22 and R23. As a result, an electric current is applied to the resistors R22 and R23 based on the voltages generated on both the ends of the resistors R22 and R23. An electric current approximately equal to the electric currents flowing in the resistors R22 and R23 is applied also to the resistors R21 and R24. This is because the electric current applied between the bases and the emitters of the transistors TR7 and TR8 becomes negligible small.

The voltage is generated also at the resistors R21 and R24, and thus the constant voltage is generated at the collector of the transistor TR7 and the collector of the transistor TR8. This constant voltage is supplied as the bias voltage to the bases of the transistors TR5 and TR6.

A ratio of the resistor R21 to a synthesized resistor of the resistors R22 and R23, and a ratio of the resistor R24 to the synthesized resistor of the resistors R22 and R23 are set to suitable values. As a result, a DC offset of the output voltage can be adjusted. Only one resistor may be provided instead of the resistors R22 and R23.

Figure 13:
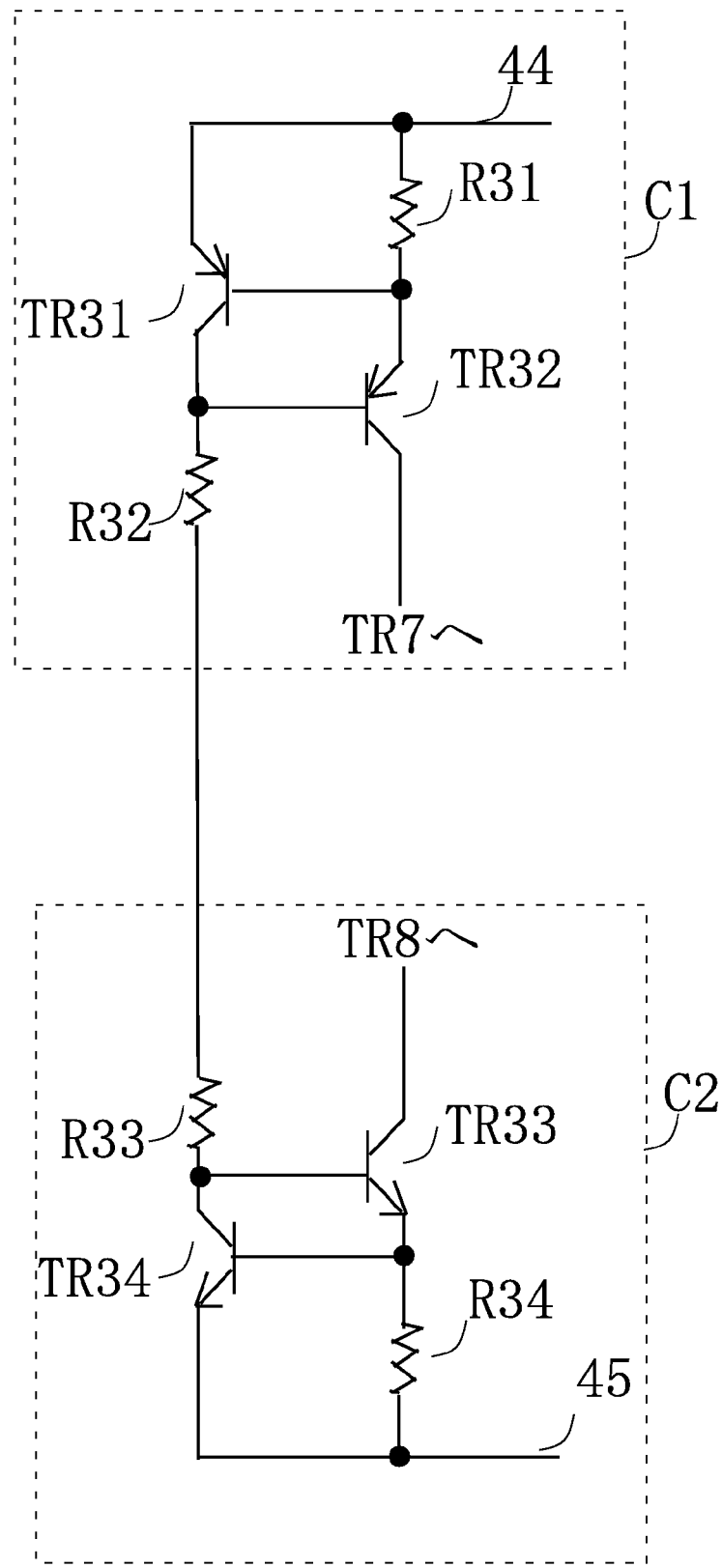
FIG. 13 is a circuit diagram of a constant current source.

When the constant voltage source is a main element of the bias circuit, the constant current sources C1 and C2 do not require high accuracy. For this reason, the constant current sources C1 and C2 can form a very simple circuit configuration. FIG. 13 is one example illustrating the circuit of the constant current sources C1 and C2.

{Transistors TR3 and TR4}

As described above, the transistors TR3 and TR4 form the emitter follower circuit whose input is the input signal 62. As a result, a bad influence of the base-to-collector capacitance Cob of the transistors TR5 and TR6 in the amplifying circuit 1 can be reduced.

The transistor TR3 is described as the example, but the same is true for TR4. When the amplifying circuit 1 does not have the transistor TR3, the emitter of the transistor TR7 is connected directly to the non-inverting input terminal 42. Therefore, in view of an alternating current, the positive component 62A is input directly into the base of the transistor TR5. This is because the transistor TR7 functions only as apart of the constant voltage source, and does not function in a manner of an alternating current. The base-to-collector capacitance Cob of the transistor TR5 is multiplied by gains of the resistors R1 and R5, and thus obtains a very large value. An input resistor component Rg (not shown) present at the non-inverting input terminal 42 in series and the base-to-collector capacitance Cob of the transistor TR5 form a low-pass filter, and thus a high-frequency component of the positive component 62A is uselessly attenuated.

As shown in FIG. 12, the amplifying circuit 1 has the emitter follower circuit including the transistor TR3. Therefore, in view of the input resistor component Rg, only the base-to-collector capacitance Cob of the transistor TR3 is present. This is because when the direct current amplification factor of the transistor TR3 is represented by hfe, the base-to-collector capacitance Cob of the transistor TR5 is multiplied by 1/hfe to obtain a very small value, and thus can be ignored. The base-to-collector capacitance Cob of the transistor TR3 is not multiplied by gain due to the resistor, and thus obtains a very small value. Therefore, even if the input resistor component Rg and the base-to-collector capacitance Cob of the transistor TR3 form a low-pass filter, the high-frequency component is not uselessly attenuated. Therefore, the influence of Cob can be made to be very small.

{Constant Current Sources C1 and C2}

A resistor can be inserted instead of the constant current sources C1 and C2. However, when the resistor is inserted instead of the constant current sources C1 and C2, the inserted resistor functions as a load for a signal line. When the value of the resistor is increased so that it does not function as the load, the bias current becomes very low. In FIG. 12, when the constant current sources C1 and C2 are used, an impedance with respect to the signal line can obtain infinite value, and a suitable bias current can be applied.

{Influence of Temperature Property of Transistor}

For example, when the temperature properties of the transistors TR3, TR4, TR7 and TR8 are different from the temperature properties of the transistors TR1, TR2, TR5 and TR6, and the base-to-emitter voltages Vbe of the transistors TR1, TR2, TR5 and TR6 fluctuate due to the temperature, the collector current of the transistor TR5 fluctuates. In order to solve this problem, the temperature properties of the transistors TR3, TR4, TR7 and TR8 are made to be equal to the temperature properties of the transistors TR1, TR2, TR5 and TR6. That is, even if the collector current of the transistor TR5 is influenced by the temperature and fluctuates, a collector current of the transistor TR7 is allowed to fluctuate by the same amount according to the temperature, thereby canceling the influence of the temperature.

That is, a total voltage (2.4 V) of the base-to-emitter voltages Vbe of the transistors TR3, TR4, TR7 and TR8 is allowed to fluctuate according to the temperature by the fluctuation in the temperature of the total voltage of the base-to-emitter voltages Vbe of the transistors TR1, TR2, TR5 and TR6 (more specifically, including the voltages of the resistors R1 and R2) according to the temperature. However, actually, when the total voltage of the base-to-emitter voltages Vbe of the transistors TR3, TR4, TR7 and TR8 fluctuates according to the temperature, an electric current flowing in the resistors R21 and R24, namely, the voltages of the resistors R21 and R24 also fluctuate according to the temperature. As a result, since the transistors TR3, TR4, TR7 and TR8 can be allowed to fluctuate more than the transistors TR1, TR2, TR5 and TR6 by a change in the voltages of the resistors R21 and R22. For this reason, the influence of the temperature of the collector current in the transistor TR5 can be reduced more quickly.

The embodiment described herein is illustrative. The present invention therefore is not limited to the above embodiment, and the above embodiment can be suitably modified without departing from the scope of the gist thereof.

What is claimed is:

1. An amplifying circuit comprising:
a first stage amplifying circuit for amplifying a first input signal to be input into an inverting input terminal and a second input signal to be input into a non-inverting input terminal, and for outputting a first stage amplification signal, wherein
the first stage amplifying circuit includes
a first transistor forming a first emitter follower circuit whose input is a positive component of the first input signal, a predetermined first potential being applied to a collector of the first transistor,
a second transistor forming a second emitter follower circuit whose input is a negative component of the first input signal, a predetermined second potential being applied to a collector of the second transistor,
a third transistor forming a third emitter follower circuit whose input is a positive component of the second input signal, a predetermined third potential being applied to a collector of the third transistor,
a fourth transistor forming a fourth emitter follower circuit whose input is a negative component of the second input signal, a predetermined fourth potential being applied to a collector of the fourth transistor,
a fifth transistor having an emitter to be connected to an output of the first emitter follower circuit, a base to be connected to an output of the third emitter follower circuit, and a collector to which an electric potential of a positive power source is applied via a first collector resistor and from which a positive component of the first stage amplification signal is output, and
a sixth transistor having an emitter to be connected to an output of the second emitter follower circuit, a base to be connected to an output of the fourth emitter follower circuit, and a collector to which an electric potential of a negative power source is applied via a second collector resistor and from which a negative component of the first stage amplification signal is output.

2. The amplifying circuit according to claim 1, wherein the first stage amplifying circuit further includes
a first resistor to be connected between an emitter of the first transistor and the emitter of the fifth transistor, and
a second resistor to be connected between an emitter of the second transistor and the emitter of the sixth transistor.

3. The amplifying circuit according to claim 2, wherein the first stage amplifying circuit further includes
a suppression circuit for suppressing a fluctuation in a potential difference between the base of the fifth transistor and the base of the sixth transistor.

4. The amplifying circuit according to claim 3, wherein the suppression circuit includes
a seventh transistor having a base and a collector to be connected to the base of the fifth transistor, and an emitter to be connected to the emitter of the third transistor,
an eighth transistor having a base and a collector to be connected to the base of the sixth transistor, and an emitter to be connected to an emitter of the fourth transistor,
a third resistor to be connected between an emitter of the third transistor and the emitter of the seventh transistor, and
a fourth resistor to be connected between the emitter of the fourth transistor and the emitter of the eighth transistor.

5. The amplifying circuit according to claim 4, wherein the suppression circuit further includes
a first capacitor to be connected between the emitter of the third transistor and the seventh transistor in parallel with the third resistor, and
a second capacitor to be connected between the emitter of the fourth transistor and the eighth transistor in parallel with the fourth resistor.

6. The amplifying circuit according to claim 1, further comprising:
a subsequent stage amplifying circuit for amplifying the first stage amplification signal; and
a buffer circuit for converting an output impedance of the subsequent stage amplifying circuit, wherein
the subsequent stage amplifying circuit includes
a ninth transistor having a collector to be connected to the buffer circuit and forming an emitter grounding amplifier circuit whose input is the positive component of the first stage amplification signal, a fifth resistor having one end to be connected to the collector of the ninth transistor and the other end to be grounded, a tenth transistor having a collector to be connected to the buffer circuit and forming an emitter grounding amplifier circuit whose input is a negative component of the first stage amplification signal, a sixth resistor having one end to be connected to the collector of the tenth transistor and the other end to be grounded.

7. An amplifying circuit comprising:

a first stage amplifying circuit for amplifying a first input signal to be input into an inverting input terminal and a second input signal to be input into a non-inverting input terminal and outputting a first stage amplification signal, wherein the first stage amplifying circuit includes a first transistor forming a first emitter follower circuit whose input is a positive component of the second input signal, a predetermined first potential being applied to a collector of the first transistor, a second transistor forming a second emitter follower circuit whose input is a negative component of the second input signal, a predetermined second potential being applied to a collector of the second transistor, a third transistor having an emitter to be connected to the emitter of the first transistor, a fourth transistor having an emitter to be connected to the emitter of the second transistor, a first resistor connected between a collector of the third transistor and a base of the third transistor, a second resistor connected between the base of the third transistor and a base of the fourth transistor, a third resistor connected between a collector of the fourth transistor and the base of the fourth transistor, a fifth transistor having an emitter to which a positive component of the first input signal is input, a base to be connected to the collector of the third transistor, and a collector to which an electric potential of a positive power source is applied via a first collector resistor and from which a positive component of the first stage amplification signal is output, and a sixth transistor having an emitter into which a negative component of the first input signal is input, a base to be connected to a collector of the fourth transistor and a collector to which an electric potential of a negative power source is applied via a second collector resistor and from which a negative component of the first stage amplification signal is output.

8. The amplifying circuit according to claim 7, wherein the first stage amplifying circuit further includes a seventh transistor forming a third emitter follower circuit whose input is the positive component of the first input signal, an emitter of the seventh transistor being connected to the emitter of the fifth transistor, a predetermined third potential being applied to a collector of the seventh transistor, and an eighth transistor forming a fourth emitter follower circuit whose input is the negative component of the first input signal, an emitter of the eighth transistor being connected to the emitter of the sixth transistor, a predetermined fourth potential being applied to a collector of the eighth transistor.

9. The amplifying circuit according to claim 8, wherein the first stage amplifying circuit further includes a fourth resistor to be connected between the emitter of the seventh transistor and the emitter of the fifth transistor, and a fifth resistor to be connected between the emitter of the eighth transistor and the emitter of the sixth transistor.

10. The amplifying circuit according to claim 7, further comprising:

a subsequent stage amplifying circuit for amplifying the first stage amplification signal; and a buffer circuit for converting an output impedance of the subsequent stage amplifying circuit, wherein the subsequent stage amplifying circuit includes a ninth transistor having a collector to be connected to the buffer circuit and forming an emitter grounding amplifier circuit whose input is the positive component of the first stage amplification signal, a sixth resistor having one end to be connected to a collector of the ninth transistor and the other end to be grounded, a tenth transistor having a collector to be connected to the buffer circuit and forming an emitter grounding amplifier circuit whose input is the negative component of the first stage amplification signal, a seventh resistor having one end to be connected to a collector of the tenth transistor and the other end to be grounded.

* * * * *